United States Patent
Hayes et al.

(10) Patent No.: US 8,772,624 B2
(45) Date of Patent: *Jul. 8, 2014

(54) SOLAR CELL ENCAPSULANT LAYERS WITH ENHANCED STABILITY AND ADHESION

(75) Inventors: Richard Allen Hayes, Beaumont, TX (US); Geraldine M. Lenges, Wilmington, DE (US); Steven C. Pesek, Orange, TX (US); Sam Louis Samuels, Landenberg, PA (US); Charles Anthony Smith, Vienna, WV (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1338 days.

This patent is subject to a terminal disclaimer.

(21) Appl. No.: 11/495,249

(22) Filed: Jul. 28, 2006

(65) Prior Publication Data
US 2008/0023063 A1     Jan. 31, 2008

(51) Int. Cl.
*H01L 31/0203*     (2014.01)

(52) U.S. Cl.
USPC .............................. 136/251; 136/259; 438/64

(58) Field of Classification Search
USPC ....................... 136/251, 259; 438/64
See application file for complete search history.

(56) References Cited

U.S. PATENT DOCUMENTS

| | | | |
|---|---|---|---|
| 3,264,272 A * | 8/1966 | Rees | 428/36.9 |
| 3,344,014 A | 9/1967 | Rees | |
| 3,762,988 A | 10/1973 | Clock et al. | |
| 4,663,228 A | 5/1987 | Bolton et al. | |
| 5,476,553 A | 12/1995 | Hanoka et al. | |
| 5,478,402 A * | 12/1995 | Hanoka | 136/251 |
| 5,733,382 A | 3/1998 | Hanoka | |
| 5,741,370 A | 4/1998 | Hanoka | |
| 5,762,720 A | 6/1998 | Hanoka et al. | |
| 5,763,062 A | 6/1998 | Smith et al. | |
| 5,986,203 A | 11/1999 | Hanoka et al. | |
| 6,114,046 A * | 9/2000 | Hanoka | 428/515 |
| 6,187,448 B1 * | 2/2001 | Hanoka et al. | 428/515 |
| 6,319,596 B1 | 11/2001 | Kernander et al. | |
| 6,320,116 B1 | 11/2001 | Hanoka | |
| 6,353,042 B1 | 3/2002 | Hanoka et al. | |
| 6,586,271 B2 | 7/2003 | Hanoka | |

(Continued)

FOREIGN PATENT DOCUMENTS

JP    S56-116047    2/1983
JP    H2-94574 A    4/1990

(Continued)

OTHER PUBLICATIONS

Baum, Bernard, et al., in "Solar Collectors. Final Report", DOE/CS/35359-T1 (DE84011480), DOE6081.1, Contract No. AC4-78CS35359, (Springborn Laboratories, Inc.)., Jun. 1983.

(Continued)

*Primary Examiner* — Jayne Mershon

(57) ABSTRACT

The present invention provides a solar cell module comprising at least one encapsulant layer which has 1) a total thickness of from about 0.1 to about 20 mils and 2) at least one surface layer made of ionomers containing a finite amount of polymerized residues of α-olefins and from about 18 to about 25 wt % of polymerized residues of α,β-ethylenically unsaturated carboxylic acids. The present invention also provides a process of manufacturing the solar cell module.

38 Claims, 1 Drawing Sheet

(56) References Cited

U.S. PATENT DOCUMENTS

| | | | |
|---|---|---|---|
| 6,690,930 B1 | 2/2004 | Dupre | |
| 2002/0004555 A1* | 1/2002 | Di-Benedetto et al. | 525/66 |
| 2002/0155302 A1 | 10/2002 | Smith et al. | |
| 2003/0000568 A1* | 1/2003 | Gonsiorawski | 136/251 |
| 2003/0124296 A1 | 7/2003 | Smith | |
| 2004/0011755 A1 | 1/2004 | Wood | |
| 2004/0144415 A1 | 7/2004 | Arhart | |
| 2005/0274410 A1* | 12/2005 | Yuuki et al. | 136/251 |
| 2005/0279401 A1* | 12/2005 | Arhart et al. | 136/251 |
| 2006/0057392 A1 | 3/2006 | Smillie et al. | |
| 2006/0084763 A1 | 4/2006 | Arhart et al. | |
| 2006/0141212 A1 | 6/2006 | Smith et al. | |
| 2006/0165929 A1 | 7/2006 | Lenges et al. | |
| 2007/0221268 A1 | 9/2007 | Hasch | |
| 2008/0017241 A1 | 1/2008 | Anderson et al. | |
| 2008/0023064 A1 | 1/2008 | Hayes et al. | |
| 2008/0264471 A1* | 10/2008 | Hayes | 136/251 |
| 2008/0264481 A1* | 10/2008 | Hayes | 136/256 |
| 2009/0023867 A1 | 1/2009 | Nishijima et al. | |
| 2009/0120489 A1 | 5/2009 | Nishijima et al. | |

FOREIGN PATENT DOCUMENTS

| | | |
|---|---|---|
| JP | 06-322334 A | 11/1994 |
| JP | 35-10646 B2 | 11/1994 |
| JP | 08-316508 A | 11/1996 |
| JP | 11-026791 A | 1/1999 |
| JP | 2000-186114 A | 7/2000 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2005-064268 | 3/2005 |
| JP | 2006-032308 A | 2/2006 |
| JP | 2006-035874 A | 2/2006 |
| JP | 2006-036875 A | 2/2006 |
| JP | 2006-036876 A | 2/2006 |
| JP | 2006-186237 A | 7/2006 |
| JP | 2006-190865 A | 7/2006 |
| JP | 2006-190867 A | 7/2006 |
| WO | 99/04971 A2 | 2/1999 |
| WO | WO 99/58334 | 11/1999 |
| WO | 2006/002389 A1 | 1/2006 |
| WO | 2006/085603 A1 | 8/2006 |
| WO | 2006/095762 A1 | 9/2006 |

OTHER PUBLICATIONS

U.S. Appl. No. 11/796.565, filed Apr. 30, 2007, Inventor Richard Allen Hayes.
DuPont™ Sentry Glas® Plus, Laminating Guide, Oct. 2006.
PCT International Search Report and Written Opinion for International Application No. PCT/US2007/016698, filed Jul. 24, 2007, dated May 26, 2008.
PCT International Preliminary Report on Patentability for International application No. PCT/US2007/016698, dated Feb. 12, 2009.

* cited by examiner

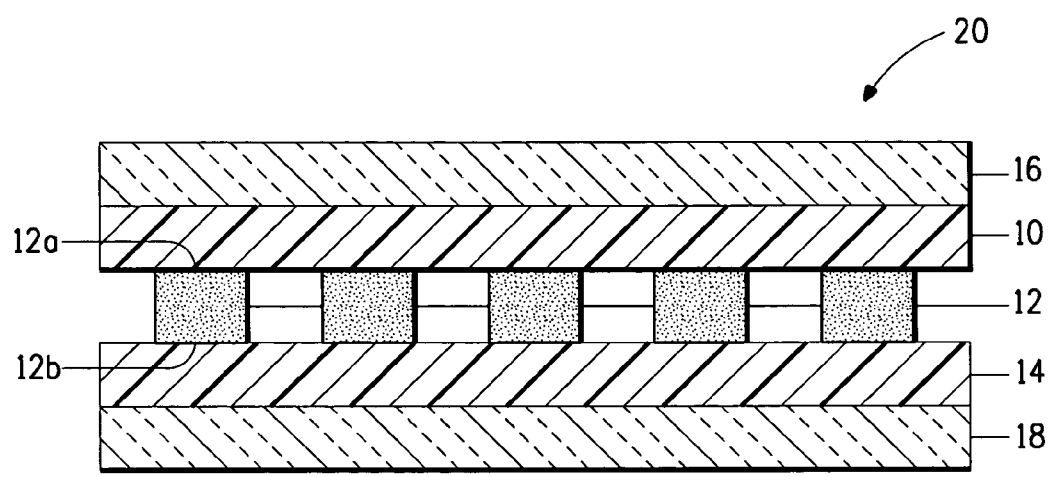

SOLAR CELL ENCAPSULANT LAYERS WITH ENHANCED STABILITY AND ADHESION

FIELD OF THE INVENTION

The present invention relates to solar cell modules comprising encapsulant layers with enhanced stability and adhesion.

BACKGROUND OF THE INVENTION

As a renewable energy resource, the use of solar cell modules is rapidly expanding. With increasingly complex solar cell modules, also referred to as photovoltaic modules, comes an increased demand for enhanced functional encapsulant materials. Photovoltaic (solar) cell modules are units that convert light energy into electrical energy. Typical or conventional construction of a solar cell module consists of at least 5 structural layers. The layers of a conventional solar cell module are constructed in the following order starting from the top, or incident layer (that is, the layer first contacted by light) and continuing to the backing (the layer furthest removed from the incident layer): (1) incident layer or front-sheet, (2) front-sheet (or first) encapsulant layer, (3) voltage-generating layer (or solar cell layer), (4) back-sheet (second) encapsulant layer, and (5) backing layer or back-sheet. The function of the incident layer is to provide a transparent protective window that will allow sunlight into the solar cell module. The incident layer is typically a glass plate or a thin polymeric film (such as a fluoropolymer or polyester film), but could conceivably be any material that is transparent to sunlight.

The encapsulant layers of solar cell modules are designed to encapsulate and protect the fragile voltage-generating layer. Generally, a solar cell module will incorporate at least two encapsulant layers sandwiched around the voltage-generating layer. The optical properties of the front-sheet encapsulant layer must be such that light can be effectively transmitted to the voltage-generating layer. Over the years, a wide variety of polymeric interlayers have been developed to be used as encapsulant layers. In general, these polymeric interlayers must possess a combination of characteristics including very high optical clarity, low haze, high impact resistance, shock absorbance, excellent ultraviolet (UV) light resistance, good long term thermal stability, excellent adhesion to glass and other solar cell laminate layers, low UV light transmittance, low moisture absorption, high moisture resistance, excellent long term weatherability, among other requirements. Widely used encapsulant materials utilized currently include complex, multicomponent compositions based on ethylene vinyl acetate (EVA), ionomer, polyvinylbutyral (PVB), thermoplastic polyurethane (TPU), polyvinylchloride (PVC), metallocene-catalyzed linear low density polyethylenes, polyolefin block elastomers, ethylene acrylate copolymers, such as poly(ethylene-co-methyl acrylate) and poly(ethylene-co-butyl acrylate), acid copolymers, silicone elastomers, epoxy resins, and the like.

EVA compositions, which have commonly been utilized as the encapsulant layer within solar cell modules, suffer the shortcomings of low adhesion to the other components incorporated within the solar cell module, low creep resistance during the lamination process and end-use and low weathering and light stability. These shortcomings have generally been overcome through the formulation of adhesion primers, peroxide curing agents, and thermal and UV stabilizer packages into the EVA compositions, which complicates the sheet production and ensuing lamination processes.

A more recent development has been the use of higher modulus ethylene copolymer ionomers within solar cell construction. For example, Maruyama et al. in Japanese Patent No. JP S56-116047, have disclosed a bi-layer encapsulant layer wherein the first layer is derived from EVA with a low VA content (20 wt % or lower), polyethylene, or soft PVC and the second layer derived from ionomer or EVA with high VA content (20 wt % or higher). Also exemplified is an ionomer/EVA bi-layer for use as an encapsulant layer, with the ionomer surface in contact with the outer solar cell layers, such as glass.

Okaniwa, et. al., in Japanese Patent No. JP H2-94574(A), have disclosed embossed films, such as PET film, to diffuse the incident light going into the solar cell. They further disclose "a tacky adhesive film layer" encapsulant, such as EVA, PVB, ionomer and polyethylene resins, with an encapsulant thickness of between 20 and 300 μm (0.8-11 mils).

Baum, Bernard, et. al., in "Solar Collectors. Final Report", DOE/CS/35359-T1 (DE84011480), DOE6081.1, Contract No. AC4-78CS35359 (Springborn Laboratories, Inc.), June, 1983, have disclosed a list of usable solar cell encapsulant materials which include ethylene/acrylic acid, EAA-435® (a product of Dow Chemical Co.) and ionomer, Surlyn® 1707 (a product of E.I. du Pont de Nemours and Company).

U.S. Pat. Nos. 5,476,553; 5,478,402; and 5,733,382 have disclosed the use of encapsulant layers derived from ionomers formed by the partial neutralization of ethylene-methacrylic acid copolymers or ethylene-acrylic acid copolymers with inorganic bases and the use of Surlyn® 1601 and Surlyn® 1707 (E.I. du Pont de Nemours and Company). The laminates disclosed therein were produced with or without additional adhesion primers.

U.S. Pat. Nos. 5,741,370; 5,762,720 and 5,986,203 have disclosed a solar cell module back-sheet which is a thermoplastic polyolefin including a mixture of at least two ionomers.

U.S. Pat. Nos. 6,114,046 and 6,353,042, have disclosed a solar cell laminate encapsulant material which includes a layer of metallocene polyethylene disposed between two layers of ionomer.

U.S. Pat. No. 6,319,596 has disclosed a solar cell encapsulant layer comprising a polyolefin with an ionomer surface.

U.S. Pat. Nos. 6,320,116 and 6,586,271 have disclosed solar cell encapsulant layers with reduced creep through treatment with electron beam radiation.

U.S. Pat. No. 6,690,930 and US Patent Application No. 2003/0000568, have disclosed the use of Surlyn® 1705-1 and Surlyn® 1706 (E.I. du Pont de Nemours and Company) zinc ionomers as solar cell encapsulants.

However, there is a continuing need for solar cell encapsulant layers which provide adequate protection to the solar cell, have a long lifetime within the end-use and provide even greater levels of adhesion to the other solar cell laminate layers, preferably without the use of adhesion primers to simplify the producing processes. The present invention provides tailored solar cell encapsulant sheets meeting all these requirements.

SUMMARY OF THE INVENTION

In one aspect, the present invention is directed to a solar cell module or laminate comprising: (i) a first encapsulant layer, (ii) a solar cell layer comprising one or a plurality of electronically interconnected solar cells and having two opposite surfaces, a light-receiving surface and a rear surface, and (iii) an optional second encapsulant layer, wherein a) the first encapsulant layer has a total thickness of from about 0.1 to about 20 mils, b) the first encapsulant layer comprises at least one surface layer derived from a ionomeric composition comprising a finite amount of polymerized residues of an α-olefin and from about 18 to about 25 wt % of polymerized residues of an α,β-ethylenically unsaturated carboxylic acid based on the total weight of the composition, and c) the first and optional second encapsulant layers are laminated to each of the two opposite surfaces of said solar cell layer.

In one particular embodiment of the present invention, the first encapsulant layer consists essentially of the ionomeric composition.

In another embodiment, the first encapsulant layer is laminated to the light-receiving surface of the solar cell layer and the optional second encapsulant layer is laminated to the rear surface of the solar cell layer.

In yet another embodiment, the solar cell module of the present invention further comprises (iv) an incident layer laminated to the first encapsulant layer and away from the solar cell layer, and (v) a back-sheet laminated to the rear surface of the solar cell layer, or to the optional second encapsulant layer and away from the solar cell layer when the optional second encapsulant layer is present.

In yet another embodiment, the optional second encapsulant layer has the same composition as the first encapsulant layer.

In another aspect, the present invention is directed to a solar cell module consisting essentially of, from top to bottom, (i) an incident layer that is laminated to, (ii) a first encapsulant layer that is laminated to, (iii) a solar cell layer comprising one or a plurality of electronically interconnected solar cells, which is laminated to, (iv) an optional second encapsulant layer that is laminated to, (v) a back-sheet, wherein said first encapsulant layer has a total thickness of from about 0.1 to about 20 mils and comprises at least one surface layer derived from a ionomeric composition comprising a finite amount of polymerized residues of an α-olefin and from about 18 to about 25 wt % of polymerized residues of an α,β-ethylenically unsaturated carboxylic acid based on the total weight of the composition.

In yet another aspect, the present invention is directed to a process of manufacturing a solar cell module comprising: (i) providing an assembly comprising from top to bottom an incident layer, a first encapsulant layer, a solar cell layer comprising one or a plurality of electronically interconnected solar cells, an optional second encapsulant layer, and a back-sheet and (ii) laminating the assembly to form the solar cell module, wherein the first encapsulant layer has a total thickness of from about 0.1 to about 20 mils and comprises at least one surface layer derived from a ionomeric composition comprising a finite amount of polymerized residues of an α-olefin and from about 18 to about 25 wt % of polymerized residues of an α,β-ethylenically unsaturated carboxylic acid based on the total weight of the composition.

In a particular embodiment, the step of lamination in manufacturing the solar cell module is conducted by subjecting the assembly to heat, or heat and pressure, or heat and vacuum.

BRIEF DESCRIPTION OF THE DRAWINGS

FIG. 1 is a cross-sectional view of one particular embodiment of the solar cell module or laminate 20 of the present invention, which comprises from top to bottom an incident layer 16, a first encapsulant layer 10, a solar cell layer 12, an optional second encapsulant layer 14, and a back-sheet 18.

DETAILED DESCRIPTION OF THE INVENTION

To the extent permitted by the United States law, all publications, patent applications, patents, and other references mentioned herein are incorporated by reference in their entirety.

The materials, methods, and examples herein are illustrative only and the scope of the present invention should be judged only by the claims.

DEFINITIONS

The following definitions apply to the terms as used throughout this specification, unless otherwise limited in specific instances.

Unless stated otherwise, all percentages, parts, ratios, etc., are by weight.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range.

When the term "about" is used in describing a value or an end-point of a range, the disclosure should be understood to include the specific value or end-point referred to.

The terms "finite amount" and "finite value", as used herein, are interchangeable and refer to an amount that is greater than zero.

In the present application, the terms "sheet" and "film" are used in their broad sense interchangeably.

Solar Cell Modules or Laminates

In one aspect, the present invention is a solar cell module or a solar cell laminate comprising a first encapsulant layer, a solar cell layer, and an optional second encapsulant layer, wherein (i) the first encapsulant layer has a total thickness of about 0.1 to about 20 mils and comprises at least one surface layer derived from an ionomeric composition comprising a finite amount of polymerized residues of an α-olefin and greater than or equal to about 18 wt % of polymerized residues of an α,β-ethylenically unsaturated carboxylic acid based on the total weight of the polymeric composition, (ii) the solar cell layer comprises one or a plurality of electronically interconnected solar cells and has two opposite surfaces, a light-receiving surface and a rear surface, and (iii) the first and optional second encapsulant layers are laminated to each of the two opposite surfaces of the solar cell layer.

In a preferred embodiment, the first encapsulant layer is laminated to the light-receiving surface of the solar cell layer and the optional second encapsulant layer is laminated to the rear surface of the encapsulant layer.

In one particular embodiment, as illustrated in FIG. 1, the solar cell module or laminate 20 of the present invention may further comprise (i) a transparent incident layer (front sheet) 16, such as a layer of glass, wherein the incident layer 16 is laminated to the first encapsulant layer 10 and away from the solar cell layer 12, and (ii) a back-sheet 18, which is laminated to the rear surface of the solar cell layer 12b or, when the optional second encapsulant layer 14 is present, laminated to the second encapsulant layer 14 and away from the solar cell layer 12.

Also within the scope of the present invention, the solar cell modules or laminates may further comprise one or more additional encapsulant layers and/or other additional layers of films or sheets.

I. The First Encapsulant Layer:

In accordance to the present invention, the first encapsulant layer included in the solar cell module has a total thickness of from about 0.1 to about 20 mils (about 0.003 to about 0.51 mm) and comprises at least one surface layer derived from an ionomeric composition containing a finite amount of polymerized residues of an α-olefin and greater than or equal to about 18 wt % of polymerized residues of an α,β-ethylenically unsaturated carboxylic acid based on the total weight of the ionomeric composition. It can be heated and be caused to form an adhesive bond with other encapsulant layer materials, flexible plastic materials, rigid materials, and/or solar cells.

In accordance to the present invention, the first encapsulant layer may be a single-layer or multilayer film or sheet comprising at least one surface layer derived from the ionomeric composition described above. By multilayer, it is meant that the encapsulant layer may be a bi-layer, tri-layer, or include even more layers. The other layers may be formed from any material known within the art. Suitable compositions that maybe used as the other layers include, but are not limited to, ionomers, ethylene vinyl acetate (EVA), acoustic poly(vinyl acetal), acoustic poly(vinyl butyral), polyvinylbutyral (PVB), thermoplastic polyurethane (TPU), polyvinylchloride (PVC), metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers, epoxy resins and combinations thereof.

In a particular embodiment, where the encapsulant layer is in a multilayer form, both surface layers are derived from the ionomeric compositions containing a finite amount of α-olefins and greater than or equal to about 18 wt % of α,β-ethylenically unsaturated carboxylic acids to provide increased levels of adhesion.

I.I The Ionomeric Composition:

The ionomeric composition used herein comprises a finite amount of polymerized residues of α-olefins and greater than or equal to about 18 wt % of polymerized residues of α,β-ethylenically unsaturated carboxylic acids based on the total weight of the composition. Such ionomeric compositions provide the encapsulant layer derived therefrom with enhanced adhesion, clarity, percent light transmission and other physical properties. Preferably, the ionomeric compositions used herein comprise from about 18 to about 25 wt %, or more preferably, from about 18 to about 23 wt %, or most preferably, from 20 to about 23 wt % of polymerized residues of α,β-ethylenically unsaturated carboxylic acids.

The α-olefins used herein incorporate from 2 to 10 carbon atoms. The α-olefins may be selected from the group consisting of ethylene, propylene, 1-butene, 1-pentene, 1-hexene, 1-heptene, 3-methyl-1-butene, 4-methyl-1-pentene, and the like and mixtures thereof. Preferably, the α-olefin is ethylene.

The α,β-ethylenically unsaturated carboxylic acids used herein may be selected from the group consisting of acrylic acid, methacrylic acid, itaconic acid, maleic acid, maleic anhydride, fumaric acid, monomethyl maleic acid, and mixtures thereof. Preferably, the α,β-ethylenically unsaturated carboxylic acids are selected from the group consisting of acrylic acid, methacrylic acid and mixtures thereof.

The ionomeric compositions used herein may optionally independently contain polymerized residues of other unsaturated comonomers. Specific examples of preferable other unsaturated comonomers include, but are not limited to, methyl acrylate, methyl methacrylate, ethyl acrylate, ethyl methacrylate, propyl acrylate, propyl methacrylate, isopropyl acrylate, isopropyl methacrylate, butyl acrylate, butyl methacrylate, isobutyl acrylate, isobutyl methacrylate, tert-butyl acrylate, tert-butyl methacrylate, octyl acrylate, octyl methacrylate, undecyl acrylate, undecyl methacrylate, octadecyl acrylate, octadecyl methacrylate, dodecyl acrylate, dodecyl methacrylate, 2-ethylhexyl acrylate, 2-ethylhexyl methacrylate, isobornyl acrylate, isobornyl methacrylate, lauryl acrylate, lauryl methacrylate, 2-hydroxyethyl acrylate, 2-hydroxyethyl methacrylate, glycidyl acrylate, glycidyl methacrylate, poly(ethylene glycol)acrylate, poly(ethylene glycol)methacrylate, poly(ethylene glycol) methyl ether acrylate, poly(ethylene glycol) methyl ether methacrylate, poly(ethylene glycol) behenyl ether acrylate, poly(ethylene glycol) behenyl ether methacrylate, poly(ethylene glycol) 4-nonylphenyl ether acrylate, poly(ethylene glycol) 4-nonylphenyl ether methacrylate, poly(ethylene glycol) phenyl ether acrylate, poly(ethylene glycol) phenyl ether methacrylate, dimethyl maleate, diethyl maleate, dibutyl maleate, dimethyl fumarate, diethyl fumarate, dibutyl fumarate, dimenthyl fumarate and the like and mixtures thereof. Preferably, the other unsaturated comonomers are independently selected from the group consisting of, methyl acrylate, methyl methacrylate, butyl acrylate, butyl methacrylate, glycidyl methacrylate and mixtures thereof. Preferably, the ionomeric compositions of the present invention independently contain between 0 and about 50 wt % of polymerized residues of the other unsaturated comonomer, based on the total weight of the composition. More preferably, the ionomeric compositions of the present invention independently contain between 0 and about 30 wt %, or most preferably, between 0 and about 20 wt % of polymerized residues of the other unsaturated comonomers. The parent acid copolymers, which the ionomers are derived from, may be polymerized as disclosed, for example, in U.S. Pat. No. 3,404,134, U.S. Pat. No. 5,028,674, U.S. Pat. No. 6,500,888 and U.S. Pat. No. 6,518,365.

It is noted that the encapsulant layer derived from the ionomeric compositions described above exhibits improved toughness relative to what would be expected of a shaped article comprising a higher acid content. It is believed that the improved toughness is obtained by preparing a parent acid copolymer base resin with a lower melt index (MI) before it is neutralized. The parent acid copolymer resin of the present invention preferably has a MI of less than 60 g/10 min, or more preferably, less than 55 g/10 min, or even more preferably, less than 50 g/10 min, or most preferably, less than 35 g/10 min, as determined at 190° C. The MI can be measured by any standard test, such as test methods ISO 1133 and ASTM D1238, which are generally conducted at a temperature of 190° C. with a load of 2160 g.

To form the ionomeric compositions, the parent acid copolymers may be neutralized from about 10% to about 100% with metallic ions based on the total carboxylic acid content. Preferably, parent acid copolymers are from about 10% to about 50%, or more preferably, from about 20% to about 40% neutralized with metallic ions. The metallic ions may be monovalent, divalent, trivalent, multivalent, or mixtures of ions having the same or different valencies. Exemplary monovalent metallic ions include, but are not limited to, sodium, potassium, lithium, silver, mercury, copper, and the like and mixtures thereof. Exemplary divalent metallic ions include, but are not limited to, beryllium, magnesium, calcium, strontium, barium, copper, cadmium, mercury, tin, lead, iron, cobalt, nickel, zinc, and the like and mixtures thereof. Exemplary trivalent metallic ions include, but are not limited to, aluminum, scandium, iron, yttrium, and the like and mixtures thereof. Exemplary multivalent metallic ions include, but are not limited to, titanium, zirconium, hafnium, vanadium, tantalum, tungsten, chromium, cerium, iron, and the like and mixtures thereof. Notably, when the metallic ion is multivalent, complexing agents, such as stearate, oleate, salicylate, and phenolate radicals are included, as disclosed within U.S. Pat. No. 3,404,134. Preferably, the metallic ion may be selected from the group consisting of sodium, lithium, magnesium, zinc, aluminum, and mixtures thereof. More preferably, the metallic ion may be selected from the group consisting of sodium, zinc, and mixtures thereof. Most preferably, the metallic ion is zinc. The parent acid copolymers of the present invention may be neutralized as disclosed, for example, in U.S. Pat. No. 3,404,134.

The ionomeric compositions used herein preferably have a MI less than about 10 g/10 min, as measured by ASTM method D1238 at 190° C., to reduce resin creep (flow) during the lamination process and within the end-use. More preferably, the ionomeric compositions have a MI less than about 5 g/10 min, or most preferably, less than about 3 g/10 min. The ionomeric compositions also preferably have a flexural modulus greater than about 40,000 psi, as measured by ASTM method D638. More preferably, the ionomeric compositions have a flexural modulus greater than about 50,000 psi, and most preferably, greater than about 60,000 psi.

I.II Additives:

The ionomeric compositions used herein contained in the first encapsulant layer of the solar cell module may further contain additives which effectively reduce the melt flow of the resin, to the limit of producing thermoset films or sheets. The use of such additives will enhance the upper end-use temperature and reduce creep of the encapsulant layer and laminates of the present invention, both during the lamination process and the end-uses thereof. Typically, the end-use temperature will be enhanced up to 20° C. to 70° C. In addition, laminates produced from such materials will be fire resistant. By reducing the melt flow of the thermoplastic films or sheets of the present invention, the material will have a reduced tendency to melt and flow out of the laminate and therefore less likely to serve as additional fire fuel. Specific examples of melt flow reducing additives include, but are not limited to, organic peroxides, such as 2,5-dimethylhexane-2,5-dihydroperoxide, 2,5-dimethyl-2,5-di(tert-betylperoxy)hexane-3, di-tert-butyl peroxide, tert-butylcumyl peroxide, 2,5-dimethyl-2,5-di(tert-butylperoxy)hexane, dicumyl peroxide, alpha, alpha'-bis(tert-butyl-peroxyisopropyl)benzene, n-butyl-4,4-bis(tert-butylperoxy)valerate, 2,2-bis(tert-butylperoxy)butane, 1,1-bis(tert-butylperoxy)cyclohexane, 1,1-bis(tert-butylperoxy)-3,3,5-trimethyl-cyclohexane, tert-butyl peroxybenzoate, benzoyl peroxide, and the like and mixtures or combinations thereof. The organic peroxide may decompose at a temperature of about 100° C. or higher to generate radicals. Preferably, the organic peroxides have a decomposition temperature which affords a half life of 10 hours at about 70° C. or higher to provide improved stability for blending operations. Typically, the organic peroxides will be added at a level of between about 0.01 and about 10 wt % based on the total weight of composition. If desired, initiators, such as dibutyltin dilaurate, may be used. Typically, initiators are added at a level of from about 0.01 to about 0.05 wt % based on the total weight of composition. If desired, inhibitors, such as hydroquinone, hydroquinone monomethyl ether, p-benzoquinone, and methylhydroquinone, may be added for the purpose of enhancing control to the reaction and stability. Typically, the inhibitors would be added at a level of less than about 5 wt % based on the total weight of the composition. However, for the sake of process simplification and ease, it is preferred that the encapsulant layer used herein does not incorporate cross-linking additives, such as the abovementioned peroxides.

It is understood that the ionomeric compositions used herein may further contain any additive known within the art. Such exemplary additives include, but are not limited to, plasticizers, processing aides, flow enhancing additives, lubricants, pigments, dyes, flame retardants, impact modifiers, nucleating agents to increase crystallinity, antiblocking agents such as silica, thermal stabilizers, hindered amine light stabilizers (HALS), UV absorbers, UV stabilizers, dispersants, surfactants, chelating agents, coupling agents, adhesives, primers, reinforcement additives, such as glass fiber, fillers and the like.

Thermal stabilizers are well disclosed within the art. Any known thermal stabilizer will find utility within the present invention. General classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds which destroy peroxide, hydroxylamines, nitrones, thiosynergists, benzofuranones, indolinones, and the like and mixtures thereof. The ionomeric compositions disclosed herein may comprise 0 to about 10.0 wt % of the thermal stabilizers, based on the total weight of the composition. Preferably, the polymeric compositions disclosed herein comprise 0 to about 5.0 wt %, or more preferably, 0 to about 1.0 wt % of the thermal stabilizers.

UV absorbers are well disclosed within the art. Any known UV absorber will find utility within the present invention. Preferable general classes of UV absorbers include, but are not limited to, benzotriazoles, hydroxybenzophenones, hydroxyphenyl triazines, esters of substituted and unsubstituted benzoic acids, and the like and mixtures thereof. The ionomeric compositions disclosed herein may comprise 0 to about 10.0 wt % of the UV absorbers, based on the total weight of the composition. Preferably, the polymeric compositions disclosed herein comprise 0 to about 5.0 wt %, or more preferably, 0 to about 1.0 wt % of the UV absorbers.

Generally, HALS are disclosed to be secondary, tertiary, acetylated, N-hydrocarbyloxy substituted, hydroxy substituted N-hydrocarbyloxy substituted, or other substituted cyclic amines which further incorporate steric hindrance, generally derived from aliphatic substitution on the carbon atoms adjacent to the amine function. Essentially any HALS known within the art may find utility within the present invention. The polymeric compositions disclosed herein may comprise 0 to about 10.0 wt % of HALS, based on the total weight of the composition. Preferably, the ionomeric compositions disclosed herein comprise 0 to about 5.0 wt %, or more preferably, 0 to about 1.0 wt % of HALS.

Silane coupling agents may be added in the ionomeric compositions to enhance the adhesive strengths. Specific examples of the silane coupling agents include, but are not limited to, gamma-chloropropylmethoxysilane, vinyltriethoxysilane, vinyltris(beta-methoxyethoxy)silane, gamma-methacryloxypropylmethoxysilane, vinyltriacetoxysilane, gamma-glycidoxypropyltrimethoxysilane, gamma-glycidoxypropyltriethoxysilane, beta-(3,4-epoxycyclohexyl)ethyltrimethoxysilane, vinyltrichlorosilane, gamma-mercaptopropylmethoxysilane, gamma-aminopropyltriethoxysilane, N-beta-(aminoethyl)-gamma-aminopropyltrimethoxysilane, and the like and mixtures thereof. These silane coupling agent materials may be used at a level of about 5 wt % or less, or preferably, about 0.001 to about 5 wt %, based on the total weight of the resin composition.

I.III. Thickness:

Typically, the first encapsulant layer included in the solar cell module has a total thickness of from about 0.1 to about 20 mils (about 0.003 to 0.51 mm). The thinner solar cell encapsulant films, for example, with a total thickness of from about 0.1 to about 5 mils (about 0.003 to about 0.13 mm), are generally utilized within flexible solar cell laminates. On the other hand, the thicker solar cell encapsulant sheets, for example, with a total thickness of from about 10 to about 20 mils (about 0.25 to about 0.51 mm), are generally utilized within rigid solar cell laminates. The thickness of the individual sub-layer components which make up the total multilayer encapsulant layer of the present invention is not critical and may be independently varied depending on the particular application. Preferably, the ionomeric surface layers are minimized in thickness. Preferably, the ionomeric surface layers are independently equal to or less than about 5 mils (0.13 mm) thick. More preferably, the ionomeric surface layers are independently equal to or less than about 3 mils (0.08 mm), or even more preferably, equal to or less than about 2 mils (0.05 mm), or most preferably, equal to or less than about 1 mil (0.03 mm) thick.

I.IV. Manufacture:

In accordance to the present invention, the encapsulant layer described above, which has at least one ionomeric surface layer, may be produced through any known process. The encapsulant layer may be produced through the use of preformed ionomer and other layer films and sheets, laminates thereof, extrusion coated multilayer films or sheets, co-extrusion casting and blown film processes. Generally, the films or sheets are produced through extrusion casting or blown film processes.

I.V. Advantages:

Within the safety glass glazing art, the conditioning of poly(vinyl butyral) and ionomeric interlayers is known and practiced to provide the highest adhesion possible to provide the attributes commonly associated with safety glass. Conditioning of ionomeric solar cell encapsulant layers has not been disclosed within the art and can explain the generally recognized need to use adhesives and primers to provide the desired level of adhesion between the encapsulant layer and the other solar cell laminate layers. The encapsulant layer described above provides many desirable benefits to the overall solar cell module and the process to produce the solar cell laminate. First, the at least one surface layer that is derived from the ionomeric composition having high acid level provides significant enhancement in adhesion to the other solar cell laminate layers, especially to the rigid support layers, such as the glass layer, without the need for the incorporation of adhesion promoters and additives or the need for the application of primers to the glass or other solar cell laminate layers. The at least one ionomeric surface layer also makes the multilayer encapsulant layer tack-free and prevents it from blocking when rolled or stacked in storage or when manipulated during the production of the solar cell laminates. Moreover, the presence of the at least one surface layer derived from zinc-neutralized, high acid content ionomers further reduces the impact of adhesion of the encapsulant layer when it is conditioned at high relative humidity (RH) environments. These surprising attributes of the encapsulant layers will provide the highly desirable ability for laminators to significantly reduce or avoid complicated solar cell encapsulant layer conditioning or storage processes, thereby greatly simplifying the overall solar cell lamination process.

In addition, when the encapsulant layer is in a multilayer form, it relegates the preferable soft, low modulus layers, which have a tendency to block and stick, to the inner layer. On the other hand, as the ionomeric layers tend to be rigid and have a high modulus, the incorporation of the other layer(s) substantially enhances the overall flexibility of the encapsulant layer and lowers the modulus to provide adequate physical shock protection for the fragile solar cell components.

In a preferable embodiment, none of the layers contained within the multilayer solar cell encapsulant layer of the present invention are cross-linked, allowing for the avoidance of the complication of formulating the resin compositions with, for example, peroxide cross-linking agents, and producing curable sheets therefrom.

As a further benefit, the expensive stabilizers, such as the UV absorbers, may be concentrated in one or both of the ionomeric surface layers, where the lowest overall concentration can most efficiently protect the overall multilayer encapsulant film or sheet and, in turn, the solar cell laminate.

II. The Optional Second Encapsulant Layer and Other Additional Encapsulant Layers:

The optional second encapsulant layer or any other additional encapsulant layers comprised in the solar cell module of the present invention may be derived from any type of suitable films or sheets. Preferably, the optional second encapsulant layer is derived from ionomers, ethylene vinyl acetate (EVA), acoustic poly(vinyl acetal), acoustic poly(vinyl butyral), polyvinylbutyral (PVB), thermoplastic polyurethane (PU), polyvinylchloride (PVC), metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers or epoxy resins. More preferably, the optional second encapsulant layer 14 is derived from ionomers, ethylene vinyl acetate (EVA), polyvinylbutyral (PVB), metallocene-catalyzed linear low density polyethylenes, acid copolymers or ethylene acrylate ester copolymers. Most preferably, the optional second encapsulant layer has the same composition as the first encapsulant layer.

The thickness of the optional second encapsulant layer or any other additional encapsulant layers is not critical and may be independently varied depending on the particular application. The thickness of the optional second encapsulant layer may range from about 1 to about 120 mils (about 0.026 to about 3.00 mm). Preferably the thickness of the optional second encapsulant layer ranges from about 1 to about 40 mils (about 0.026 to about 1.02 mm), or more preferably, from about 1 to about 20 mils (about 0.026 to about 0.51 mm).

III. Surface Roughness of the Encapsulant Layers:

The first and optional second encapsulant layers comprised in the solar cell module of the present invention may have smooth or roughened surfaces. Preferably, the encapsulant layers have roughened surfaces to facilitate the de-airing of the laminates through the laminate process. The efficiency of the solar cell module is related to the appearance and transparency of the transparent front-sheet portion of the solar cell laminates and is an important feature in assessing the desirability of using the laminates. As described above, the front-sheet portion of the solar cell laminate includes the top incident layer, the solar cell layer (voltage-generating solar cell) and the encapsulant layer and any other layers laminated between the incident layer and the solar cell layer. One factor affecting the appearance of the front-sheet portion of the solar cell laminates is whether the laminate includes trapped air or air bubbles between the encapsulant layer and the rear surface of the incident layer, or between the encapsulant layer and the light-receiving surface of the solar cell layer. It is desirable to remove air in an efficient manner during the lamination process. Providing channels for the escape of air and removing air during lamination is a known method for obtaining laminates with acceptable appearance.

This can be effected by mechanically embossing or by melt fracture during extrusion followed by quenching so that the roughness is retained during handling. Retention of the surface roughness is preferable in the practice of the present invention to facilitate effective de-airing of the entrapped air during laminate preparation.

Surface roughness, Rz, can be expressed in microns by a 10-point average roughness in accordance with ISO-R468 of the International Organization for Standardization and ASMEB46.1 of the American Society of Mechanical Engineers. For sheets and films having a thickness of the present invention, 10-point average roughness, Rz, of up to 80 µm is sufficient to prevent air entrapment. The width of the channels may range from about 30 to about 300 µm, or preferably, from about 40 to about 250 µm, or more preferably, from about 50 to about 200 µm. The surface channels may be spaced from about 0.1 to about 1 mm apart, or preferably, from about 0.1 to about 0.9 mm apart, or more preferably, from about 0.15 to about 0.85 mm apart.

Surface roughness, Rz, measurements from single-trace profilometer measurements can be adequate in characterizing the average peak height of a surface with roughness peaks and valleys that are nearly randomly distributed. However a single trace profilometer may not be sufficient in characterizing the texture of a surface that has certain regularities, particularly straight lines. In characterizing such surfaces, if care is taken such that the stylus does not ride in a groove or on a plateau, the Rz thus obtained can still be a valid indication of the surface roughness. Other surface parameters, such as the mean spacing (R Sm) may not be accurate because they depend on the actual path traversed. Parameters like R Sm can change depending on the angle the traversed path makes with the grooves. Surfaces with regularities like straight-line grooves are better characterized by three-dimensional or area roughness parameters such as the area peak height, ARp, and the total area roughness, ARt, and the area kurtosis (AKu) as defined in ASME B46.1. ARp is the distance between the highest point in the roughness profile over an area to the plane if all the material constituting the roughness is melted down. ARt is the difference in elevation between the highest peak and the lowest valley in the roughness profile over the area measured. In the instant invention, the surface pattern of the ionomer and/or other polymeric surface layers of the multilayer encapsulant layer 10 are characterized by $AR_t$ less than 32 µm, and the ratio of ARp to $AR_t$, also defined in ASME B46.1-1, may be between 0.42 and 0.62, or preferably, between 0.52 and 0.62. The ionomer and/or other polymeric surface layers of the multilayer encapsulant layer 10 may also have area kurtosis of less than about 5.

The present invention can be suitably practiced with any of the surface patterns described above. The surface pattern is preferably an embossed pattern. The channel depth may range from about 2 to about 80 µm, or preferably, from about 2 to about 25 µm, or more preferably, from about 12 to about 20 µm, or most preferably, from about 14 to about 20 µm. The depth may be selected so that the regular channels provide suitable paths for air to escape during the lamination process. It is desirable therefore that the depth be sufficiently deep that the air pathways are not cut off prematurely during the heating stage of the lamination process, leading to trapped air in the laminate when it cools. Also, particularly when using the higher modulus polymeric layers comprising ionomers, it can be desirable to provide relatively shallow channels in comparison to, for example, EVA or PVB interlayer surface patterns. Larger channels provide larger reservoirs for air, and hence more air that requires removal during lamination.

The encapsulant layers can be embossed on one or both sides. The embossing pattern and/or the depth thereof can be asymmetric with respect to the two sides of the multilayer encapsulant layer. That is, the embossed patterns can be the same or different, as can be the depth of the pattern on either side of the multilayer encapsulant layers. In a specific embodiment, the surface layers comprising ionomers and/or other polymeric compositions has an embossed pattern wherein the depth of the pattern on each side is in the range of from about 12 to about 20 µm. In another specific embodiment, there is an embossed pattern on one side of the multilayer encapsulant layer 10 that is orthogonal to the edges of layer, while the identical embossed pattern on the opposite side of the multilayer encapsulant layer 10 is slanted at some angle that is greater than or less than 90° to the edges. Offsetting the patterns in this manner can eliminate an undesirable optical effect in the layers.

In one particular embodiment, a surface pattern can be applied using a tool that imparts a pattern wherein the pattern requires less energy to obtain a flattened surface than conventional patterns. In the process of the present invention it is necessary to flatten the surface of the encapsulant layer during the lamination, so that the encapsulant layer surface is in complete contact with the opposing surface to which it is being laminated when the lamination process is complete. The energy required to obtain a smooth or flattened surface can vary depending upon the surface topography, as well as the type of material being flattened.

Conventional surface patterns or textures require a large percentage of the volume of the material that is raised above the imaginary plane of the flattened multilayer encapsulant layer sheet to flow to areas that lie below the imaginary plane. Encapsulant layer material that is above (primarily) and below the plane (which is the interface of the encapsulant layer and the layer to which it is being laminated to, (such as the solar cell layer, for example), after the lamination step is complete) must flow through a combination of heat, applied pressure, and time. Each particular pattern of different peak heights, spacing, volume, and other descriptors necessary to define the surface geometry will yield a corresponding amount of work or energy to compress the surface pattern. The goal is to prevent premature contact or sealing to occur prior to sufficient air removal being accomplished whether air removal is to be achieved by conventional techniques such as roll pre-pressing or vacuum bags/rings and the like.

In another embodiment, an encapsulant layer having a surface roughness that allows for high-efficiency de-airing but with less energy for compression (or at a controlled and desired level tailored for the pre-press/de-airing process) is obtained. One example of a surface pattern used in the present invention comprises projections upward from the base surface as well as voids, or depressions, in the encapsulant layer surface. Such projections and depressions would be of similar or the same volume, and located in close proximity to other such projections and voids on the encapsulant layer surface. The projections and depressions may be located such that heating and compressing the encapsulant layer surface results in more localized flow of the thermoplastic material from an area of higher thermoplastic mass (that is, a projection) to a void area (that is, depression), wherein such voids would be filled with the mass from a local projection, resulting in the encapsulant layer surface being flattened. Localized flow of the thermoplastic resin material to obtain a flattened surface would require less of an energy investment than a more conventional pattern, which requires flattening of a surface by effecting mass flow of thermoplastic material across the entire surface of the encapsulant layer. The main feature is the ability for the pattern to be flattened with relative ease as compared with the conventional art.

Several different criteria are important in the design of an appropriate surface pattern or texture for handling, ease of positioning, blocking tendency, ease of cleaning, de-airing and possessing a robust process window for laminate manufacture.

The surface pattern, as described above, may be applied to the encapsulant layer through common art processes. For example, the extruded encapsulant layer may be passed over a specially prepared surface of a die roll positioned in close proximity to the exit of the die which imparts the desired surface characteristics to one side of the molten polymer. Thus, when the surface of such roll has minute peaks and valleys, the encapsulant layer formed of polymer cast thereon will have a rough surface on the side which contacts the roll which generally conforms respectively to the valleys and peaks of the roll surface. Such die rolls are disclosed in, for example, U.S. Pat. No. 4,035,549. As is known, this rough surface is only temporary and particularly functions to facilitate de-airing during laminating after which it is melted smooth from the elevated temperature and pressure associated with autoclaving and other lamination processes.

IV. Solar Cells:

Solar cells are commonly available on an ever increasing variety as the technology evolves and is optimized. Within the present invention, a solar cell is meant to include any article which can convert light into electrical energy. Typical art examples of the various forms of solar cells include, for example, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells due to relatively low cost manufacturing ease for large scale solar cells.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620. Examples of thin film solar cell modules are those that comprise cadmium telluride or CIGS, (Cu(In—Ga)(SeS)2), thin film cells.

V. Incident Layers, Back-Sheet layers, and Other Layers:

The solar cell module of the present invention may further comprise one or more sheet layers or film layers to serve as the incident layer, the back-sheet layer, and other additional layers.

The sheet layers, such as incident and back-sheet layers, used herein may be glass or plastic sheets, such as, polycarbonate, acrylics, polyacrylate, cyclic polyolefins, such as ethylene norbornene polymers, metallocene-catalyzed polystyrene, polyamides, polyesters, fluoropolymers and the like and combinations thereof, or metal sheets, such as aluminum, steel, galvanized steel, and ceramic plates. Glass may serve as the incident layer of the solar cell laminate and the supportive back-sheet of the solar cell module may be derived from glass, rigid plastic sheets or metal sheets.

The term "glass" is meant to include not only window glass, plate glass, silicate glass, sheet glass, low iron glass, tempered glass, tempered CeO-free glass, and float glass, but also includes colored glass, specialty glass which includes ingredients to control, for example, solar heating, coated glass with, for example, sputtered metals, such as silver or indium tin oxide, for solar control purposes, E-glass, Toroglass, Solex® glass (a product of Solutia) and the like. Such specialty glasses are disclosed in, for example, U.S. Pat. Nos. 4,615,989; 5,173,212; 5,264,286; 6,150,028; 6,340,646; 6,461,736; and 6,468,934. The type of glass to be selected for a particular laminate depends on the intended use.

The film layers, such as incident, back-sheet, and other layers, used herein may be metal, such as aluminum foil, or polymeric. Preferable polymeric film materials include poly (ethylene terephthalate), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly (ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymers and the like. Most preferably, the polymeric film is bi-axially oriented poly(ethylene terephthalate) (PET) film, aluminum foil, or a fluoropolymer film, such as Tedlar® or Tefzel® films, which are commercial products of the E.I. du Pont de Nemours and Company. The polymeric film used herein may also be a multi-layer laminate material, such as a fluoropolymer/polyester/fluoropolymer (e.g., Tedlar®/Polyester/Tedlar®) laminate material or a fluoropolymer/polyester/EVA laminate material.

The thickness of the polymeric film is not critical and may be varied depending on the particular application. Generally, the thickness of the polymeric film will range from about 0.1 to about 10 mils (about 0.003 to about 0.26 mm). The polymeric film thickness may be preferably within the range of about 1 and about 4 mil (about 0.025 and about 0.1 mm).

The polymeric film is preferably sufficiently stress-relieved and shrink-stable under the coating and lamination processes. Preferably, the polymeric film is heat stabilized to provide low shrinkage characteristics when subjected to elevated temperatures (i.e. less than 2% shrinkage in both directions after 30 min at 150°).

The films used herein may serve as the incident layer 16 (such as the fluoropolymer or poly(ethylene terephthalate) film) or the back-sheet 18 (such as the fluoropolymer, aluminum foil, or poly(ethylene terephthalate) film). The films may also be included in the present solar cell module 20 as dielectric layers or a barrier layers, such as oxygen or moisture barrier layers.

If desired, a layer of non-woven glass fiber (scrim) may be included in the present solar cell laminate 20 to facilitate de-airing during the lamination process or to serve as a reinforcement for the encapsulant layer(s). The use of such scrim layers within solar cell laminates is disclosed within, for example, U.S. Pat. Nos. 5,583,057; 6,075,202; 6,204,443; 6,320,115; 6,323,416; and European Patent No. 0 769 818.

VI. Adhesives and Primers:

When even greater adhesion is desired, one or both surfaces of the solar cell laminate layers, such as the encapsulant layer(s), the incident layer, the back-sheet, and/or the solar cell layer may be treated to enhance the adhesion to other laminate layers. This treatment may take any form known within the art, including adhesives, primers, such as silanes, flame treatments, such as disclosed within U.S. Pat. Nos. 2,632,921; 2,648,097; 2,683,894; and 2,704,382, plasma treatments, such as disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the polymeric film through vacuum sputtering as disclosed in U.S. Pat. No. 4,865,711. Or, as disclosed in U.S. Pat. No. 5,415,942, a hydroxy-acrylic hydrosol primer coating that may serve as an adhesion-promoting primer for poly(ethylene terephthalate) films.

In a particular embodiment, the adhesive layer may take the form of a coating. The thickness of the adhesive/primer coating may be less than 1 mil, or preferably, less than 0.5 mil, or more preferably, less than 0.1 mil. The adhesive may be any adhesive or primer known within the art. Specific examples of adhesives and primers which may be useful in the present invention include, but are not limited to, gamma-chloropropylmethoxysilane, vinyltrichlorosilane, vinyltriethoxysilane, vinyltris(beta-methoxyethoxy)silane, gamma-methacryloxypropyltrimethoxysilane, beta-(3,4-epoxycyclohexyl)ethyltrimethoxysilane, gammaglycidoxypropyltrimethoxysilane, vinyl-triacetoxysilane, gamma-mercaptopropyltrimethoxysilane, gamma-aminopropyltriethoxysilane, N-beta-(aminoethyl)-gamma-aminopropyl-trimethoxysilane, glue, gelatine, caesin, starch, cellulose esters, aliphatic polyesters, poly(alkanoates), aliphatic-aromatic polyesters, sulfonated aliphatic-aromatic polyesters, polyamide esters, rosin/polycaprolactone triblock copolymers, rosin/poly(ethylene adipate) triblock copolymers, rosin/poly(ethylene succinate) triblock copolymers, poly(vinyl acetates), poly(ethylene-co-vinyl acetate), poly(ethylene-co-ethyl acrylate), poly(ethylene-co-methyl acrylate), poly(ethylene-co-propylene), poly(ethylene-co-1-butene), poly(ethylene-co-1-pentene), poly(styrene), acrylics, polyurethanes, sulfonated polyester urethane dispersions, nonsulfonated urethane dispersions, urethane-styrene polymer dispersions, non-ionic polyester urethane dispersions, acrylic dispersions, silanated anionic acrylate-styrene polymer dispersions, anionic acrylate-styrene dispersions, anionic acrylate-styrene-acrylonitrile dispersions, acrylate-acrylonitrile dispersions, vinyl chloride-ethylene emulsions, vinylpyrrolidone/styrene copolymer emulsions, carboxylated and noncarboxylated vinyl acetate ethylene dispersions, vinyl acetate homopolymer dispersions, polyvinyl chloride emulsions, polyvinylidene fluoride dispersions, ethylene acrylic acid dispersions, polyamide dispersions, anionic carboxylated or noncarboxylated acrylonitrile-butadiene-styrene emulsions and acrylonitrile emulsions, resin dispersions derived from styrene, resin dispersions derived from aliphatic and/or aromatic hydrocarbons, styrene-maleic anhydrides, and the like and mixtures thereof.

In another particular embodiment, the adhesive or primer is a silane that incorporates an amine function. Specific examples of such materials include, but are not limited to, gamma-aminopropyltriethoxysilane, N-beta-(aminoethyl)-gamma-aminopropyl-trimethoxysilane, and the like and mixtures thereof. Commercial examples of such materials include, for example A-1100® silane, (from the Silquest Company, formerly from the Union Carbide Company, believed to be gamma-aminopropyltrimethoxysilane) and Z6020® silane, (from the Dow Corning Corp.).

The adhesives may be applied through melt processes or through solution, emulsion, dispersion, and the like, coating processes. One of ordinary skill in the art will be able to identify appropriate process parameters based on the composition and process used for the coating formation. The above process conditions and parameters for making coatings by any method in the art are easily determined by a skilled artisan for any given composition and desired application. For example, the adhesive or primer composition can be cast, sprayed, air knifed, brushed, rolled, poured or printed or the like onto the surface. Generally the adhesive or primer is diluted into a liquid medium prior to application to provide uniform coverage over the surface. The liquid media may function as a solvent for the adhesive or primer to form solutions or may function as a non-solvent for the adhesive or primer to form dispersions or emulsions. Adhesive coatings may also be applied by spraying the molten, atomized adhesive or primer composition onto the surface. Such processes are disclosed within the art for wax coatings in, for example, U.S. Pat. Nos. 5,078,313; 5,281,446; and 5,456,754.

VII. Solar Cell Laminate Constructions:

Notably, specific solar cell laminate constructions (top (light incident) side to back side) include, but are not limited to, glass/encapsulant layer of the present invention/solar cell/encapsulant layer of the present invention/glass; glass/encapsulant layer of the present invention/solar cell/encapsulant layer of the present invention/Tedlar® film; Tedlar® film/encapsulant layer of the present invention/solar cell/encapsulant layer of the present invention/glass; Tedlar® film/encapsulant layer of the present invention/solar cell/encapsulant layer of the present invention/Tedlar® film; glass/encapsulant layer of the present invention/solar cell/encapsulant layer of the present invention/PET film; Tedlar® film/encapsulant layer of the present invention/solar cell/encapsulant layer of the present invention/PET film; glass/encapsulant layer of the present invention/solar cell/encapsulant layer of the present invention/barrier coated film/encapsulant layer of the present invention/glass; glass/ionomer encapsulant layer/solar cell/encapsulant layer of the present invention/barrier coated film/encapsulant layer of the present invention/Tedlar® film; Tedlar® film/encapsulant layer of the present invention/barrier coated film/encapsulant layer of the present invention/solar cell/encapsulant layer of the present invention/barrier coated film/encapsulant layer of the present invention/Tedlar® film; glass/encapsulant layer of the present invention/solar cell/encapsulant layer of the present invention/aluminum stock; Tedlar® film/encapsulant layer of the present invention/solar cell/encapsulant layer of the present invention/aluminum stock; glass/encapsulant layer of the present invention/solar cell/encapsulant layer of the present invention/galvanized steel sheet; glass/encapsulant layer of the present invention/solar cell/encapsulant layer of the present invention/PET film/encapsulant layer of the present invention/aluminum stock; Tedlar® film/encapsulant layer of the present invention/solar cell/encapsulant layer of the present invention/PET film/encapsulant layer of the present invention/aluminum stock; glass/encapsulant layer of the present invention/solar cell/encapsulant layer of the present invention/PET film/encapsulant layer of the present invention/galvanized steel sheet; Tedlar®/encapsulant layer of the present invention/solar cell/encapsulant layer of the present invention/PET film/encapsulant layer of the present invention/galvanized steel sheet; glass/encapsulant layer of the present invention/ solar cell/acoustic poly(vinyl butyral) encapsulant layer/ glass; glass/encapsulant layer of the present invention/solar cell/poly(vinyl butyral) encapsulant layer/Tedlar® film; Tedlar® film/ionomer encapsulant layer/solar cell/encapsulant layer of the present invention/glass; Tedlar® film/encapsulant layer of the present invention/solar cell/acid copolymer encapsulant layer/Tedlar® film; glass/encapsulant layer of the present invention/solar cell/ethylene vinyl acetate encapsulant layer/PET film; Tedlar® film/encapsulant layer of the present invention/solar cell/poly(ethylene-co-methyl acrylate) encapsulant layer/PET film; glass/poly(ethylene-co-butyl acrylate) encapsulant layer/solar cell/encapsulant layer of the present invention/barrier coated film/poly(ethylene-co-butyl acrylate) encapsulant layer/glass; glass/encapsulant layer of the present invention/solar cell/encapsulant layer of the present invention/"Tedlar®/polyester/Tedlar®" tri-layer film; Tedlar® film/encapsulant layer of the present invention/ solar cell/encapsulant layer of the present invention/"Tedlar®/polyester/Tedlar®" tri-layer film; glass/encapsulant layer of the present invention/solar cell/encapsulant layer of the present invention/"Tedlar®/polyester/EVA" tri-layer film; Tedlar® film/encapsulant layer of the present invention/ solar cell/encapsulant layer of the present invention/"Tedlar®/polyester/EVA" tri-layer film; and the like.

Manufacture of Solar Cell Module or Laminate

In a further embodiment, the present invention is a process of manufacturing a solar cell module or laminate described above.

The solar cell laminates of the present invention may be produced through autoclave and non-autoclave processes, as described below. For example, the solar cell constructs described above may be laid up in a vacuum lamination press and laminated together under vacuum with heat and standard atmospheric or elevated pressure Alternatively, the solar cell laminates may be formed by conventional autoclave processes known within the art. For example, in an exemplary process, a glass sheet, a first encapsulant layer disclosed herein, a solar cell, an optional second encapsulant layer and Tedlar® film, and a cover glass sheet are laminated together under heat and pressure and a vacuum (for example, in the range of about 27-28 inches (689-711 mm) Hg) to remove air. Preferably, the glass sheet has been washed and dried. A typical glass type is 90 mil thick annealed low iron glass. In an exemplary procedure, the laminate assembly of the present invention is placed into a bag capable of sustaining a vacuum ("a vacuum bag"), drawing the air out of the bag using a vacuum line or other means of pulling a vacuum on the bag, sealing the bag while maintaining the vacuum, placing the sealed bag in an autoclave at a temperature of about 130° C. to about 180° C., at a pressure of about 200 psi (15 bars) for from about 10 to about 50 minutes. Preferably the bag is autoclaved at a temperature of about 120° C. to about 160° C. for 20 to about 45 minutes, or more preferably, at a temperature of about 135° C. to about 160° C. for 20 to about 40 minutes, or most preferably, at a temperature of about 145° C. to about 155° C. for 25 to about 35 minutes. A vacuum ring may be substituted for the vacuum bag. One type of vacuum bags is disclosed within U.S. Pat. No. 3,311,517.

Any air trapped within the laminate assembly may be removed through a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly is passed through a set of nip rolls so that the air in the void spaces between the solar cell outside layers, the solar cell and the encapsulant layers may be squeezed out, and the edge of the assembly sealed. This process may provide the final solar cell laminate or may provide what is referred to as a pre-press assembly, depending on the materials of construction and the exact conditions utilized.

The pre-press assembly may then be placed in an air autoclave where the temperature is raised to about 120° C. to about 160° C., or preferably, between about 135° C. and about 160° C., and pressure to between about 100 psig and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the solar cell laminates are removed from the autoclave. This should not be considered limiting. Essentially any lamination process known within the art may be used with the encapsulants of the present invention.

The laminates of the present invention may also be produced through non-autoclave processes. Such non-autoclave processes are disclosed, for example, within U.S. Pat. Nos. 3,234,062; 3,852,136; 4,341,576; 4,385,951; 4,398,979; 5,536,347; 5,853,516; 6,342,116; and 5,415,909, US Patent Application No. 2004/0182493, European Patent No. EP 1 235 683 B1, and PCT Patent Application Nos. WO 91/01880 and WO 03/057478 A1. Generally, the non-autoclave processes include heating the laminate assembly or the pre-press assembly and the application of vacuum, pressure or both. For example, the pre-press may be successively passed through heating ovens and nip rolls.

If desired, the edges of the solar cell laminate may be sealed to reduce moisture and air intrusion and their potentially degradation effect on the efficiency and lifetime of the solar cell by any means disclosed within the art. General art edge seal materials include, but are not limited to, butyl rubber, polysulfide, silicone, polyurethane, polypropylene elastomers, polystyrene elastomers, block elastomers, styrene-ethylene-butylene-styrene (SEBS), and the like.

EXAMPLES

The following Examples and Comparative Examples are intended to be illustrative of the present invention, and are not intended in any way to limit the scope of the present invention. The solar cell interconnections are omitted from the examples below to clarify the structures, but any common art solar cell interconnections may be utilized within the present invention.

Methods

The following methods are used in the Examples and Comparative Examples presented hereafter.

I. Compressive Shear Strength Test:

Compressive Shear Strength was determined through the method disclosed within U.S. Pat. No. 6,599,630, the entire disclosure of which is enclosed herein by reference. Essentially, the compressive shear strength of a laminate was determined using the method detailed herein. Six 1 inch by 1 inch (25 mm by 25 mm) chips are sawed from the laminate. The chips are conditioned in a room controlled at a temperature of 23° C.±2° C. and a relative humidity of 50%±1% for one hour prior to testing. The compressive shear strength of the chip was determined using jig shown in FIG. 1 of U.S. Pat. No. 6,599,630. The chip was placed on the cut-out on the lower half of the jig, and the upper half was then placed on top of the chip. A cross-head was lowered at the rate of 0.1 inch per min (2.5 mm per min) until it contacts the upper piece of the device. As the cross-head continues to travel downward, one piece of glass of the chip begins to slides relative to the other. The compressive shear strength of the chip was the shear stress required to cause adhesive failure. The precision of this test is such that one standard deviation is typically 6% of the average result of six chips.

II. Pummel Adhesion Test:

The pummel adhesion of the samples was measured by the following procedure. For each test, a portion of the laminate, typically having dimensions of 15 by 30 cm, was subjected to the pummel test. First, this portion of the laminate was cooled for 8 hours at a temperature of −18° C. It was then held in a pummel testing machine at a 45 angle to a supporting table. A force was evenly applied over a 10 by 15 cm area of the sample with a 450 g flathead hammer at a predetermined rate until the glass became pulverized. Once the glass pulverized, the glass remaining glued to the polymeric interlayer was compared with a list of formal standards. These standards comprise a scale ranging from 0 to 10 and are given as follows:

| Percent Of The Surface Of The Polymeric - Encapsulant Pummel That Came Unglued During Breaking | Values |
|---|---|
| 100 | 0 |
| 95 | 1 |
| 90 | 2 |
| 85 | 3 |
| 60 | 4 |
| 40 | 5 |
| 20 | 6 |
| 10 | 7 |
| 5 | 8 |
| 2 | 9 |
| 0 | 10 |

The pummel test was performed on both surfaces of the laminated glass and a pummel value recorded for each surface tested. In general, good impact performance is attained at a pummel adhesion of greater than 5 for each surface, i.e., 5+5.

III. Extrusion Cast of Polymeric Sheets:

The polymeric sheets used in Examples 1-42 are extruded as follows. The polymeric resins were fed into a 1.5 inch diameter Killion extruder with a temperature profile as follows:

| Extruder Zone | Temperature (° C.) |
|---|---|
| Feed | Ambient |
| Zone 1 | 160 |
| Zone 2 | 200 |
| Zone 3 | 200 |
| Block | 210 |
| Die | 210 |

Polymer throughput was controlled by adjusting the screw speed to 70 rpm. The extruder fed a 14-inch "coathanger" die with a nominal gap of 0.038 inch. The as cast sheet was fed into a three roll stack consisting of a 6-inch diameter rubber nip roll covered with a Teflon® release film and two 12-inch diameter polished chrome chill rolls held at a temperature of between 10° C. and 15° C. The nominally 0.030 inch thick sheet was then wound onto cardboard cores at a rate of 3.3 feet/min.

IV. Preparation of Glass Laminates:

The glass laminates in Examples 1-42, 55-63, 105-112, 126-133, and 155-170 were produced in the following manner. Prior to lamination, the polymeric sheets were either "not conditioned", which means that the polymeric sheets were subject to lamination as received, or conditioned, which means that the polymeric sheets were allowed to sit in an environment with a particular relative humidity (RH) for five days at a temperature of 72° F. During lamination, a pre-press assembly of an annealed float glass sheet layer, a polymeric sheet layer, a thin Teflon® film layer, and an annealed float cover glass layer were laid up. The pre-press assembly was then placed into a vacuum bag and heated to 90° C.-100° C. for 30 min to remove any air contained between glass and polymeric layers of the pre-press assembly. The pre-press assembly was then subjected to autoclaving at 135° C. for 30 min in an air autoclave to a pressure of 200 psig (14.3 bar). The air is then cooled while no more air is added to the autoclave. After 20 min of cooling and the air temperature reaches less than about 50° C., the excess pressure was vented, the assembly removed from the autoclave, and the Teflon® film and cover glass sheet removed to provide the desired laminate.

V. Preparation of Embossed Sheet Structures:

The embossed sheet structures used in Examples 43-54, 113-117, and 134-138 were prepared on a 24-inch wide Sano multilayer coextrusion line equipped with embossing rolls utilizing common art sheet formation processes. This essentially entailed the use of an extrusion line consisting of a twin-screw extruder with a sheet die feeding melt into a calendar roll stack. The calendar rolls have an embossed surface pattern engraved into the metal surface which imparts to varying degrees a reverse image of the surface texture onto the polymer melt as it passes between and around the textured rolls. Both surfaces of the sheet were embossed with a pattern with the following characteristics:

| Mound average depth | 21 ± 4 micron |
|---|---|
| Mound peak depth | 25 ± 5 micron |
| Pattern frequency/mm | 2 |
| Mound width | 0.350 ± 0.02 mm |
| Valley width | 0.140 ± 0.02 mm |

Surface roughness, Rz, can be expressed in microns by a 10-point average roughness in accordance with ISO-R468 of the International Organization for Standardization. Roughness measurements were made using a stylus-type profilometer (Surfcom 1500A manufactured by Tokyo Seimitsu Kabushiki Kaisha of Tokyo, Japan) as described in ASME B46.1-1995 using a trace length of 26 mm. ARp and ARt, and the area kurtosis were measured by tracing the roughness over a 5.6 mm×5.6 mm area in 201 steps using the Perthometer Concept system manufactured by Mahr GmbH, Gottingen, Germany. The sheets typically have an Rz in the range of from about 15 to about 25 micron.

VI. Preparation of Laminate Structures:

The laminate structures comprising embossed sheet structures disclosed in Examples 43-54, 64-104, 118-125, 139-154 and Comparative Example CE1 were prepared as follows. Each layers of the laminate structures were stacked (laid up) to form the pre-laminate structures. The pre-laminate structures were then placed within a vacuum bag, which was sealed and placed into an oven at room temperature (25° C.±5° C.). A vacuum was then applied to remove the air from the vacuum bag. While maintaining the application of the vacuum, the vacuum bag was heated at 135° C. for 1 hour. The vacuum was then discontinued and the vacuum bag removed from the oven, allowed to cool to room temperature (25°

C.±5° C.). The laminate structures were therefore produced and removed from the vacuum bag.

VII. Compression Molding of Polymeric Plaques:

The polymeric plaques in Examples 55-60, 62, and 63 were prepared through compression molding on a Carver Melt Press. The compression molding was conducted at a temperature of 190° C. and a pressure of 20,000 psi. The plaques were then cooled to room temperature over approximately 30 min and packaged in moisture barrier packaging.

VIII. Extrusion of Polymeric Pellets:

In Examples 59, 60, and 62, a variety of polymeric compositions were dry blended and compounded on a 1 inch Killion single screw extruder, which had a melt temperature of approximately 200° C. and a rate of 2.5 pounds per hour. The screw speed ranged from 47 to 70 RPM and the rear zone temperature ranged from 120 to 170° C., depending on the composition. The adapter pressure ranged from 400 to 800 psi and power consumption ranged from about 2.5 to 3 amps. The typical extruder barrel temperature profile was as follows:

| Rear (Feed Hopper) Zone: | 120 to 170° C. |
|---|---|
| Mid Zone: | 199 to 203° C. |
| Front Zone: | 200 to 202° C. |
| Adapter: | 200 to 201° C. |

A single strand was passed through a water bath and pelletized to form small pellets. The pellets were purged with nitrogen overnight at room temperature and then sealed in a moisture barrier package.

Examples 1-21

The ionomer sheets comprising one of the ionomers listed in Table 1 were produced by extrusion cast. Examples 1-21 were glass laminates of a layer of annealed float glass sheet (6 inch by 12 inch (152 mm by 305 mm) by 2.5 mm thick) and a layer of one of the ionomer sheets listed in Table 1 (6 inch by 12 inch by 30 mil (0.76 mm) thick), wherein the tin sides of the glass layers were in contact with the sheets. These glass laminates were then subjected to 180-degree peel strength adhesion testing using an INSTRUMENTORS, Inc., Model SP-102B-3M90 SLIP/PEEL Tester at a rate of 1 inch per minute. The results are noted below within Table 1, wherein "ND" denotes "not determined".

TABLE 1

| | | Peel Adhesion | | | |
|---|---|---|---|---|---|
| | | Not | After Conditioning At | | |
| Example RH | Material | Conditioned (lbs/in) | <8% RH (lbs/in.) | 23% RH (lbs/in) | 50% (lbs/in) |
| 1 | Ionomer 1 | 1.4 | 6.2 | 5.3 | 3.2 |
| 2 | Ionomer 2 | ND | 4.1 | 3.0 | 3.6 |
| 3 | Ionomer 3 | ND | 4.7 | 4.6 | 1.8 |
| 4 | Ionomer 4 | ND | 4.8 | 3.7 | 3.1 |
| 5 | Ionomer 5 | 1.8 | 4.2 | 3.8 | 1.9 |
| 6 | Ionomer 5 | ND | 8.4 | 3.7 | 3.2 |
| 7 | Ionomer 6 | ND | 8.7 | 8.4 | 4.9 |
| 8 | Ionomer 7 | ND | 12.2 | 7.1 | 5.8 |
| 9 | Ionomer 8 | ND | 13.3 | 10.9 | 5.5 |
| 10 | Ionomer 9 | ND | 12.9 | 11.9 | 4.6 |
| 11 | Ionomer 10 | ND | 19.6 | 13.4 | 11.1 |
| 12 | Ionomer 11 | ND | 1.9 | ND | 0.9 |
| 13 | Ionomer 12 | ND | 4.0 | ND | 1.0 |
| 14 | Ionomer 13 | ND | 4.3 | 4.0 | 2.8 |
| 15 | Ionomer 14 | ND | 5.9 | 6.8 | 2.9 |
| 16 | Ionomer 15 | ND | 8.5 | ND | 3.2 |
| 17 | Ionomer 16 | 3.8 | 12.4 | 11.7 | 9.1 |
| 18 | Ionomer 17 | 4.0 | 6.9 | 8.1 | 8.4 |
| 19 | Ionomer 18 | 9.6 | 13.1 | 12.3 | 12.2 |
| 20 | Ionomer 19 | ND | 7.3 | 7.3 | 6.7 |
| 21 | Ionomer 20 | ND | 14.3 | ND | 10.8 |

Ionomer 1 was a poly(ethylene-co-methacrylic acid) containing 19 wt % of methacrylic acid that is 37% neutralized with sodium ion and having a MI of 2.6 g/10 min (190° C., ISO 1133, ASTM D1238). Ionomer 1 was prepared from the corresponding poly(ethylene-co-methacrylic acid) having a MI of 60 g/10 min (190° C., ISO 1133, ASTM D1238).
Ionomer 2 was a poly(ethylene-co-methacrylic acid) containing 21.5 wt % of methacrylic acid that is 34.5% neutralized with sodium ion and having a MI of 0.5 g/10 min (190° C., ISO 1133, ASTM D1238). Ionomer 2 was prepared from the corresponding poly(ethylene-co-methacrylic acid) having a MI of 29 g/10 min (190° C., ISO 1133, ASTM D1238).
Ionomer 3 was a poly(ethylene-co-methacrylic acid) containing 21.5 wt % of methacrylic acid that is 32.5% neutralized with sodium ion and having a MI of 0.6 g/10 min (190° C., ISO 1133, ASTM D1238). Ionomer 3 was prepared from the corresponding poly(ethylene-co-methacrylic acid) having a MI of 29 g/10 min (190° C., ISO 1133, ASTM D1238).
Ionomer 4 was a poly(ethylene-co-methacrylic acid) containing 21.5 wt % of methacrylic acid that is 31.1% neutralized with sodium ion and having a MI of 0.8 g/10 min (190° C., ISO 1133, ASTM D1238). Ionomer 4 was prepared from the corresponding poly(ethylene-co-methacrylic acid) having a MI of 29 g/10 min (190° C., ISO 1133, ASTM D1238).
Ionomer 5 was a poly(ethylene-co-methacrylic acid) containing 21.5 wt % of methacrylic acid that is 29% neutralized with sodium ion and having a MI of 0.9 g/10 min (190° C., ISO 1133, ASTM D1238). Ionomer 5 was prepared from the corresponding poly(ethylene-co-methacrylic acid) having a MI of 29 g/10 min (190° C., ISO 1133, ASTM D1238).
Ionomer 6 was a poly(ethylene-co-methacrylic acid) containing 21.5 wt % of methacrylic acid that is 24% neutralized with sodium ion and having a MI of 1.5 g/10 min (190° C., ISO 1133, ASTM D1238). Ionomer 6 was prepared from the corresponding poly(ethylene-co-methacrylic acid) having a MI of 29 g/10 min (190° C., ISO 1133, ASTM D1238).
Ionomer 7 was a poly(ethylene-co-methacrylic acid) containing 21.5 wt % of methacrylic acid that is 22.4% neutralized with sodium ion and having a MI of 1.8 g/10 min (190° C., ISO 1133, ASTM D1238). Ionomer 7 was prepared from the corresponding poly(ethylene-co-methacrylic acid) having a MI of 29 g/10 min (190° C., ISO 1133, ASTM D1238).
Ionomer 8 was a poly(ethylene-co-methacrylic acid) containing 21.5 wt % of methacrylic acid that is 22.1% neutralized with sodium ion and having a MI of 2.2 g/10 min (190° C., ISO 1133, ASTM D1238). Ionomer 8 was prepared from the corresponding poly(ethylene-co-methacrylic acid) having a MI of 29 g/10 min (190° C., ISO 1133, ASTM D1238).
Ionomer 9 was a poly(ethylene-co-methacrylic acid) containing 21.5 wt % of methacrylic acid that is 17.9% neutralized with sodium ion and having a MI of 2.7 g/10 min (190° C., ISO 1133, ASTM D1238). Ionomer 9 was prepared from the corresponding poly(ethylene-co-methacrylic acid) having a MI of 29 g/10 min (190° C., ISO 1133, ASTM D1238).
Ionomer 10 was a poly(ethylene-co-methacrylic acid) containing 21.5 wt % of methacrylic acid that is 14.6% neutralized with sodium ion and having a MI of 4.16 g/10 min (190° C., ISO 1133, ASTM D1238). Ionomer 10 was prepared from the corresponding poly(ethylene-co-methacrylic acid) having a MI of 29 g/10 min (190° C., ISO 1133, ASTM D1238).
Ionomer 11 was a poly(ethylene-co-methacrylic acid) containing 22.1 wt % of methacrylic acid that is 41.1% neutralized with sodium ion and having a MI of 0.73 g/10 min (190° C., ISO 1133, ASTM D1238). Ionomer 11 was prepared from the corresponding poly(ethylene-co-methacrylic acid) having a MI of 60 g/10 min (190° C., ISO 1133, ASTM D1238).
Ionomer 12 was a poly(ethylene-co-methacrylic acid) containing 22.1 wt % of methacrylic acid that is 37.3% neutralized with sodium ion and having a MI of 1.1 g/10 min (190° C., ISO 1133, ASTM D1238). Ionomer 12 was prepared from the corresponding poly(ethylene-co-methacrylic acid) having a MI of 60 g/10 min (190° C., ISO 1133, ASTM D1238).
Ionomer 13 was a poly(ethylene-co-methacrylic acid) containing 22.1 wt % of methacrylic acid that is 30.3% neutralized with sodium ion and having a MI of 2.26 g/10 min (190° C., ISO 1133, ASTM D1238). Ionomer 13 was prepared from the corresponding poly(ethylene-co-methacrylic acid) having a MI of 60 g/10 min (190° C., ISO 1133, ASTM D1238).
Ionomer 14 was a poly(ethylene-co-methacrylic acid) containing 22.1 wt % of methacrylic acid that is 26.0% neutralized with sodium ion and having a MI of 3.34 g/10 min (190° C., ISO 1133, ASTM D1238). Ionomer 14 was prepared from the corresponding poly(ethylene-co-methacrylic acid) having a MI of 60 g/10 min (190° C., ISO 1133, ASTM D1238).
Ionomer 15 was a poly(ethylene-co-methacrylic acid) containing 22.1 wt % of methacrylic acid that is 24.8% neutralized with sodium ion and having a MI of 3.95 g/10 min (190° C., ISO 1133, ASTM D1238). Ionomer 15 was prepared from the corresponding poly(ethylene-co-methacrylic acid) having a MI of 60 g/10 min (190° C., ISO 1133, ASTM D1238).
Ionomer 16 was a poly(ethylene-co-methacrylic acid) containing 19.0 wt % of methacrylic acid that is 37.0% neutralized with zinc ion and having a MI of 1.8 g/10 min (190° C., ISO 1133, ASTM D1238). Ionomer 16 was prepared from the corresponding poly(ethylene-co-methacrylic acid) having a MI of 60 g/10 min (190° C., ISO 1133, ASTM D1238).
Ionomer 17 was a poly(ethylene-co-methacrylic acid) containing 19.0 wt % of methacrylic acid that is 36.0% neutralized with zinc ion and having a MI of 1.3 g/10 min (190° C., ISO 1133, ASTM D1238). Ionomer 17 was prepared from the corresponding poly(ethylene-co-methacrylic acid) having a MI of 60 g/10 min (190° C., ISO 1133, ASTM D1238).
Ionomer 18 was a poly(ethylene-co-methacrylic acid) containing 19.0 wt % of methacrylic acid that is 32.0% neutralized with zinc ion and having a MI of 3.1 g/10 min (190° C., ISO 1133, ASTM D1238). Ionomer 18 was prepared from the corresponding poly(ethylene-co-methacrylic acid) having a MI of 60 g/10 min (190° C., ISO 1133, ASTM D1238).
Ionomer 19 was a poly(ethylene-co-methacrylic acid) containing 20.0 wt % of methacrylic acid that is 34.0% neutralized with zinc ion and having a MI of 1.0 g/10 min (190° C., ISO 1133, ASTM D1238). Ionomer 19 was prepared from the corresponding poly(ethylene-co-methacrylic acid) having a MI of 60 g/10 min (190° C., ISO 1133, ASTM D1238).
Ionomer 20 was a poly(ethylene-co-methacrylic acid) containing 21.5 wt % of methacrylic acid that is 32.0% neutralized with zinc ion and having a MI of 1.3 g/10 min (190° C., ISO 1133, ASTM D1238). Ionomer 20 was prepared from the corresponding poly(ethylene-co-methacrylic acid) having a MI of 60 g/10 min (190° C., ISO 1133, ASTM D1238).

Examples 22-42

Examples 22-42 were glass laminates similar to those of the Examples 1-21 except that the air sides of the glass sheets were in contact with the ionomer sheets. The laminates were also subject to 180-degree peel strength adhesion testing using an INSTRUMENTORS, Inc., Model SP-102B-3M90 SLIP/PEEL Tester at a rate of 1 inch per minute. The results are noted below within Table 2, wherein "ND" denotes "not determined".

TABLE 2

| | | Peel Adhesion After Conditioning At | | |
|---|---|---|---|---|
| Example | Material | <8% RH (lbs/in) | 23% RH (lbs/in) | 50% RH (lbs/in) |
| 22 | Ionomer 1 | 4.9 | 4.3 | 1.8 |
| 23 | Ionomer 2 | 2.3 | 1.8 | 2.2 |
| 24 | Ionomer 3 | 2.4 | 3.6 | 0.9 |
| 25 | Ionomer 4 | 3.6 | 2.4 | 1.3 |
| 26 | Ionomer 5 | 2.7 | 2.0 | 1.2 |
| 27 | Ionomer 5 | 8.0 | 2.9 | 2.1 |
| 28 | Ionomer 6 | 5.7 | 5.1 | 3.0 |
| 29 | Ionomer 7 | 9.0 | 4.2 | 4.0 |
| 30 | Ionomer 8 | 7.3 | 6.4 | 3.3 |
| 31 | Ionomer 9 | 11.0 | 8.8 | 2.9 |
| 32 | Ionomer 10 | 14.1 | 7.9 | 5.5 |
| 33 | Ionomer 11 | 2.0 | ND | 0.4 |
| 34 | Ionomer 12 | 2.2 | ND | 0.6 |
| 35 | Ionomer 13 | 3.8 | 1.6 | 2.7 |
| 36 | Ionomer 14 | 6.0 | 4.9 | 1.9 |
| 37 | Ionomer 15 | 7.9 | ND | 2.1 |
| 38 | Ionomer 16 | 6.2 | 10.7 | 6.2 |
| 39 | Ionomer 17 | 2.7 | 6.3 | 8.0 |
| 40 | Ionomer 18 | 15.2 | 6.4 | 8.2 |
| 41 | Ionomer 19 | 5.4 | 5.6 | 6.2 |
| 42 | Ionomer 20 | 12.2 | ND | 6.3 |

Examples 43-54 and Comparative Example CE 1

Examples 43-54 and comparative example CE 1 were tri-layer sheet structures with embossed surface layers (Table 3).

TABLE 3

| | Tri-layer Sheet Structures | |
|---|---|---|
| Example | Outer Layers 1 mil (0.026 mm) thick | Inner Layer 18 mils (0.4 mm) thick |
| 43 | Ionomer 1 | Ionomer 21 |
| 44 | Ionomer 17 | Ionomer 21 |
| 45 | Ionomer 22 | Ionomer 21 |
| CE 1 | Ionomer 21 | EBA 1 |
| 46 | Ionomer 1 | EBA 1 |
| 47 | Ionomer 17 | EBA 1 |
| 48 | Ionomer 22 | EBA 1 |

Ionomer 21 was a poly(ethylene-co-methacrylic acid) containing 15 wt % of methacrylic acid that is 21% neutralized with zinc ion and having a MI of 5 g/10 min (190° C., ISO 1133, ASTM D1238).
Ionomer 22 was a poly(ethylene-co-methacrylic acid) containing 19 wt % of methacrylic acid that is 39% neutralized with zinc ion and having a MI of 4 g/10 min (190° C., ISO 1133, ASTM D1238).
EBA 1 was a poly(ethylene-co-n-butyl acrylate) containing 27 wt % of n-butyl acrylate and having a MI of 4 g/10 min (190° C., ISO 1133, ASTM D1238).

A variety of laminate structures (4 inch by 4 inch (102 mm by 102 mm)) comprising the embossed sheet structures listed in Table 3 were produced to demonstrate various solar cell structures. The laminate structures included "glass/tri-layer sheet structure/glass", "fluoropolymer film/tri-layer sheet structure/glass", "aluminum sheet/tri-layer sheet structure/glass", "aluminum film/tri-layer sheet structure" and "glass/tri-layer sheet structure". The glass used was ⅛ inch (3.2 mm) thick Starphire® glass sheet (a commercial product of the PPG Corporation); the fluoropolymer film was 1.5 mil (0.38 mm) thick corona surface treated Tedlar® grade WH15BL3 (a product of the DuPont Company); and the aluminum sheet was ⅛ inch (3.2 mm) thick and was 5052 alloyed with 2.5 wt % magnesium and conformed to Federal specification QQ-A-250/8 and ASTM B209.

In addition, 6 inch by 12 inch (152 mm by 305 mm) laminates comprising one of the embossed sheets listed in Table 3 and one from the group consisting of Starphire® glass sheet, Tedlar® grade WH15BL3, and aluminum sheet were prepared, and subject to peel adhesion tests using test method ASTM D3330. The results are listed in Table 4 where the term "lock up" denotes that the "substrate"/"tri-layer sheet structure" interface did not fail and the term "ND" denotes "not determined".

TABLE 4

| | | Peel Adhesion | | |
|---|---|---|---|---|
| Example | Embossed Sheet Exp. | Glass/ Sheet Exp. (lbs/in) | Tedlar ®/ Sheet Exp. (lbs/in) | Aluminum/ Sheet Exp. (lbs/in) |
| 49 | 43 | 11.6 | lock up | 9.0 |
| 50 | 44 | 9.3 | lock up | 7.7 |
| 51 | 45 | 12.1 | lock up | ND |
| 52 | 46 | 4.8 | lock up | 5.9 |
| 53 | 47 | 7.1 | 10.4 | ND |
| 54 | 48 | 4.2 | lock up | ND |

Example 55

A polymeric plaque (6 inch by 7 inch (152 mm by 178 mm) by 40 mil (1.02 mm) thick) were produced through compression molding from a copoly(ethylene-co-methacrylic acid) containing 21.4 wt % of methacrylic acid that was 31% neutralized with sodium. The glass laminate of Example 55 had the structure of glass/polymeric plaque/glass, wherein the two glass layer were made of 6 inch by 7 inch by 2.5 mm thick clear annealed float glass plates and the tin sides of the glass plates were in contact with the polymeric plaque. It was found to have a compressive shear strength of 5095 psi and a pummel adhesion at an average of 7.

Example 56

A polymeric plaque (6 inch by 7 inch (152 mm by 178 mm) by 40 mil (1.02 mm) thick) were produced through compression molding from a copoly(ethylene-co-methacrylic acid) containing 21.4 wt % of methacrylic acid that was 32% neutralized with zinc. The glass laminate of Example 56 had the structure of glass/polymeric plaque/glass, wherein the two glass layer were made of 6 inch by 7 inch by 2.5 mm thick clear annealed float glass plates and the tin sides of the glass plates were in contact with the polymeric plaque. It was found to have a compressive shear strength of 5338 psi and a pummel adhesion at an average of 8.

Example 57

A polymeric plaque (6 inch by 7 inch (152 mm by 178 mm) by 40 mil (1.02 mm) thick) were produced through compression molding from a copoly(ethylene-co-methacrylic acid) containing 21.4 wt % of methacrylic acid that was 31% neutralized with sodium. The glass laminate of Example 57 had the structure of glass/polymeric plaque/glass, wherein the two glass layer were made of 6 inch by 7 inch by 2.5 mm thick clear annealed float glass plates and the air sides of the glass plates were in contact with the polymeric plaque. It was found to have a compressive shear strength of 4742 psi and a pummel adhesion at an average of 5.

Example 58

A polymeric plaque (6 inch by 7 inch (152 mm by 178 mm) by 40 mil (1.02 mm) thick) were produced through compression molding from a copoly(ethylene-co-methacrylic acid) containing 21.4 wt % of methacrylic acid that was 32% neutralized with zinc. The glass laminate of Example 58 had the structure of glass/polymeric plaque/glass, wherein the two glass layer were made of 6 inch by 7 inch by 2.5 mm thick clear annealed float glass plates and the air sides of the glass plates were in contact with the polymeric plaque. It was found to have a compressive shear strength of 5027 psi and a pummel adhesion at an average of 8.

Example 59

In this Example, polymeric pellets were prepared from a polymeric composition consisting of 1) 99.60 wt % of poly (ethylene-co-methacrylic acid) which contains 21.4 wt % of methacrylic acid that is 29% neutralized with sodium, 2) 0.30 wt % of Tinuvin® 326 stabilizer, a product of the Ciba Company, which was reported to be 2-(3-tert-butyl-2-hydroxy-5-methylphenyl)-5-chloro-2H-benzotriazole (CAS Number 3896-11-5), and 3) 0.10 wt % of Irganox® 1010 stabilizer, a product of the Ciba Company, which was reported to be pentaerythritol tetrakis(3,5-di-tert-butyl-4-hydroxyhydrocinnamate) (CAS Number 6683-19-8). 6 inch by 7 inch (152 mm by 178 mm) by 25 mil (0.64 mm) thick polymeric plaques were then produced from these polymeric pellets.

Example 59 was a glass laminate of a 12 inch by 12 inch (305 mm by 305 mm) by 2.5 mm thick annealed float glass plate and the polymeric plaque prepared above. It was found to have a 90 degree peel strength of 1.5 lb/inch at a peel rate of 1 inch/min, and a 90 degree peel strength of 1.5 lb/inch at a peel rate of 2 inches/min.

Example 60

In this Example, polymeric pellets were prepared from a polymeric composition consisting of 1) 99.60 wt % of poly (ethylene-co-methacrylic acid) containing 21.4 wt % of methacrylic acid that is 32% neutralized with zinc, 2) 0.30 wt % of Tinuvin® 328 stabilizer, a product of the Ciba Company, which was reported to be 2-(2H-benzotriazol-2-yl)-4,6-di-tert-pentylphenol (CAS Number 25973-55-1), and 3) 0.10 wt % of HP-136® stabilizer, a product of the Ciba Company, which was reported to be 5,7-di-tert-butyl-3-(3,4-di-methylphenyl)-3H-benzofuran-2-one (CAS Number 181314-48-7). 6 inch by 7 inch (152 mm by 178 mm) by 25 mil (0.64 mm) thick polymeric plaques were then produced from these polymeric pellets.

The glass laminate of Example 60 comprised a 12 inch by 12 inch (305 mm by 305 mm) by 2.5 mm thick annealed float glass plate and the polymeric plaque prepared above. It was found to have a 90 degree peel strength of 1.5 lb/inch at a peel rate of 9.2 inch/min, and a 90 degree peel strength of 10.1 lb/inch at a peel rate of 2 inches/min.

Example 61

Example 61 was a glass laminate having the structure of glass/polymeric plaque interlayer/glass, wherein the polymeric plaque interlayer was made of three layers of 2 inch by 2 inch (51 mm×51 mm) by 25 mil (0.64 mm) thick plaques prepared from the polymeric composition in Example 60, and the two glass layers were made of two 2 inch by 2 inch by 2.5 mm thick pieces of annealed gloat glass plate.

Example 62

In this Example, polymeric pellets were prepared from a polymeric composition consisting of 1) 99.70 wt % of poly (ethylene-co-methacrylic acid) containing 21.4 wt % of methacrylic acid that is 32% neutralized with zinc and 2) 0.30 wt % of Chimassorb® 944 FD stabilizer, a product of the Ciba Company, which was reported to be poly[[6-[(1,1,3,3-tetramethylbutyl)amino]-s-triazine-2,4-diyl]-[(2,2,6,6-tetramethyl-4-piperidyl)imino]-hexamethylene-[(2,2,6,6-tetramethyl-4-piperidylimino]] (CAS Number 71878-19-8). 6 inch by 7 inch (152 mm by 178 mm) by 25 mil (0.64 mm) thick polymeric plaques were then produced from these polymeric pellets through compression molding.

Example 62 was a glass laminate between a layer of the polymeric plaque and a layer of 12 inch by 12 inch (305 mm by 305 mm) by 2.5 mm thick annealed float glass plate.

Example 63

In this Example, a 6 inch by 7 inch (152 mm by 178 mm) by 40 mil (1.02 mm) thick polymeric plaque was produced from a copoly(ethylene-co-methacrylic acid) containing 21.4 wt % of methacrylic acid that was 32% neutralized with zinc through compression molding.

Example 63 was a glass laminate composed of a layer of the polymeric plaque and a layer of 6 inch by 6 inch (152 mm by 152 mm) by 2.5 mm thick annealed float glass plate, wherein the polymeric plaque was conditioned at 5% RH at a temperature of 72° F. overnight prior to lamination and the tin side of the glass plate was in contact with the polymeric plaque.

The glass laminate of Example 63 was then subjected to 90 degree peel strength adhesion testing using an INSTRU-MENTORS, Inc., Model SP-102B-3M90 SLIP/PEEL Tester. The laminate was peeled at rates of 1 inch and 2 inches per min. They were found to have a peel adhesion of greater than 30 lbs/in.

Examples 64-70

As listed in Table 5, Examples 64-66 are ionomer films produced through a blown film process commonly known within the art.

TABLE 5

| | Monolayer Film Structures | |
|---|---|---|
| Example | Material | Thickness |
| 64 | Ionomer 16 | 1 mil (0.03 mm) |
| 65 | Ionomer 19 | 2 mils (0.05 mm) |
| 66 | Ionomer 20 | 3 mils (0.08 mm) |

As listed in Table 6, Examples 67-70 are 12 inch by 12 inch solar cell laminate structures comprising one of the ionomer films of Examples 64-66. For those laminates which include a flexible film as an outer layer, a glass cover sheet (3 mm thick) is added to the laminate structure and then removed after the lamination process.

TABLE 6

Solar Cell Laminate Structures

| Example | Layer 1 | Layer 2 | Layer 3 | Layer 4 | Layer 5 |
|---|---|---|---|---|---|
| 67 | FPF | Example 64 | Solar Cell 1 | Example 64 | FPF |
| 68 | FPF | Example 65 | Solar Cell 2 | Example 65 | ALF |
| 69 | FPF | Example 66 | Solar Cell 3 | Example 66 | FPF |
| 70 | FPF | Example 66 | Solar Cell 4 | Example 64 | ALF |

ALF is an aluminum sheet (3.2 mm thick) that is 5052 alloyed with 2.5 wt % of magnesium and conforms to Federal specification QQ-A-250/8 and ASTM B209.
FPF is a corona surface treated Tedlar ® film grade WH15BL3 (1.5 mil (0.038 mm) thick), a product of the DuPont Corporation.
Solar Cell 1 is a 10 inch by 10 inch amorphous silicon photovoltaic device comprising a stainless steel substrate (125 μm thick) with an amorphous silicon semiconductor layer (U.S. Pat. No. 6,093,581, Example 1).
Solar Cell 2 is a 10 inch by 10 inch copper indium diselenide (CIS) photovoltaic device (U.S. Pat. No. 6,353,042, column 6, line 19).
Solar Cell 3 is a 10 inch by 10 inch cadmium telluride (CdTe) photovoltaic device (U.S. Pat. No. 6,353,042, column 6, line 49).
Solar Cell 4 is a silicon solar cell made from a 10 inch by 10 inch polycrystalline EFG-grown wafer (U.S. Pat. No. 6,660,930, column 7, line 61).

Examples 71-81

As listed in Table 7, Examples 71-75 are bi-layer film structures produced through a blown film process, as is commonly known within the art.

TABLE 7

Bi-layer Film Structures

| Example | Layer 1 (Thickness) | Layer 2 (Thickness) |
|---|---|---|
| 71 | Ionomer 16 (0.5 mil (0.013 mm)) | EBA 2 (2 mil (0.05 mm)) |
| 72 | Ionomer 19 (1 mil (0.03 mm)) | EVA 1 (3 mil (0.08 mm)) |
| 73 | Ionomer 20 (0.7 mil (0.018 mm)) | EMA 1 (2 mil (0.05 mm)) |
| 74 | ACR 1 (0.5 mil (0.013 mm)) | Ionomer 20 (2 mil (0.05 mm)) |
| 75 | Ionomer 22 (1 mil (0.03 mm)) | Ionomer 21 (3 mil (0.08 mm)) |

ACR 1 is a poly(ethylene-co-methacrylic acid) containing 12 wt % of methacrylic acid and having a MI of 1 g/10 min (190° C., ISO 1133, ASTM D1238).
EBA 2 is a poly(ethylene-co-n-butyl acrylate) containing 30 wt % of n-butyl acrylate and having a MI of 1 g/10 min (190° C., ISO 1133, ASTM D1238).
EMA 1 is a poly(ethylene-co-methyl acrylate) containing 30 wt % of methyl acrylate.
EVA 1 is a formulated composition of poly(ethylene-co-vinyl acetate) containing 32 wt % of vinyl acetate content.

As listed in Table 8, Examples 76-81 are solar cell laminate structures comprising the bi-layer film structures in Table 7.

TABLE 8

Solar Cell Laminate Structures

| Example | Layer 1 | Layer 2 | Layer 3 | Layer 4 | Layer 5 |
|---|---|---|---|---|---|
| 76 | FPF | Example 71 | Solar Cell 1 | Example 71 | FPF |
| 77 | FPF | Example 72 | Solar Cell 2 | Example 72 | ALF |
| 78 | FPF | Example 73 | Solar Cell 3 | Example 73 | FPF |
| 79 | FPF | Example 73 | Solar Cell 4 | Example 72 | FPF |
| 80 | FPF | Example 74 | Solar Cell 1 | Example 74 | ALF |
| 81 | FPF | Example 75 | Solar Cell 4 | Example 75 | FPF |

Examples 82-93

As listed in Table 9, Examples 82-87 tri-layer film structures produced through a blown film process, as commonly known within the art.

TABLE 9

Tri-layer Film Structures

| Example | Outer Layers (Thickness) | Inner Layer (Thickness) |
|---|---|---|
| 82 | Ionomer 17 (0.5 mil (0.013 mm)) | EBA 1 (2 mil (0.05 mm)) |
| 83 | Ionomer 19 (1 mil (0.03 mm)) | EEA (3 mil (0.08 mm)) |
| 84 | Ionomer 20 (0.7 mil (0.018 mm)) | EMA 2 (2 mil (0.05 mm)) |
| 85 | ACR 2 (0.5 mil (0.013 mm)) | Ionomer 20 (2 mil (0.05 mm)) |
| 86 | Ionomer 19 (1 mil (0.03 mm)) | Ionomer 21 (3 mil (0.08 mm)) |
| 87 | Ionomer 20 (0.5 mils, (0.013 mm)) | EVA 1 (3 mils, (0.08 mm)) |

ACR 2 is a poly(ethylene-co-methacrylic acid) containing 19 wt % of methacrylic acid and having a MI of 2 g/10 min (190° C., ISO 1133, ASTM D1238).
Ionomer 6 is a poly(ethylene-co-methacrylic acid) containing 21 wt % of methacrylic acid that is 30% neutralized with zinc ion and having a MI of 1 g/10 min (190° C., ISO 1133, ASTM D1238).
EEA is a poly(ethylene-co-ethyl acrylate) containing 32 wt % of ethyl acrylate and having a MI of 0.4 g/10 min (190° C., ISO 1133, ASTM D1238).
EMA 2 is a poly(ethylene-co-methyl acrylate) containing 35 wt % of methyl acrylate and having a MI of 0.7 g/10 min (190° C., ISO 1133, ASTM D1238).

As listed in Table 10, Examples 88-93 are 12 inch by 12 inch solar cell laminate structures comprising the tri-layer film structures of Examples 82-87.

TABLE 10

Solar Cell Laminate Structures

| Example | Layer 1 | Layer 2 | Layer 3 | Layer 4 | Layer 5 |
|---|---|---|---|---|---|
| 88 | FPF | Example 82 | Solar Cell 1 | Example 82 | FPF |
| 89 | FPF | Example 83 | Solar Cell 2 | Example 83 | ALF |
| 90 | FPF | Example 84 | Solar Cell 3 | Example 84 | FPF |
| 91 | FPF | Example 85 | Solar Cell 4 | Example 85 | FPF |
| 92 | FPF | Example 86 | Solar Cell 1 | Example 86 | FPF |
| 93 | FPF | Example 87 | Solar Cell 4 | Example 87 | ALF |

Examples 94-104

As listed in Table 11, Examples 84-96 are monolayer sheet structures having embossed surface layers.

TABLE 11

Monolayer Sheet Structures.

| Example | Material | Thickness |
|---|---|---|
| 94 | Ionomer 16 | 10 mil (0.25 mm) |
| 95 | Ionomer 19 | 15 mil (0.38 mm) |
| 96 | Ionomer 20 | 20 mil (0.51 mm) |

As listed in Table 12, Examples 97-104 are solar cell laminate structures produced in a manner similar to that is used in preparing the laminate structures in Examples 43-54.

TABLE 12

Solar Cell Laminate Structures

| Example | Layer 1 | Layer 2 | Layer 3 | Layer 4 | Layer 5 |
|---|---|---|---|---|---|
| 97, 105 | Glass 1 | Example 94 | Solar Cell 1 | Example 94 | Glass 1 |
| 98, 106 | Glass 2 | Example 95 | Solar Cell 2 | Example 95 | Glass 2 |
| 99, 107 | FPF | Example 96 | Solar Cell 3 | Example 96 | ALF |
| 100, 108 | Glass 2 | Example 94 | Solar Cell 2 | EBA 3 | ALF |
| 101, 109 | Glass 1 | Example 95 | Solar Cell 4 | EVA 2 | ALF |
| 102, 110 | FPF | Example 96 | Solar Cell 1 | ACR 3 | ALF |

TABLE 12-continued

Solar Cell Laminate Structures

| Example | Layer 1 | Layer 2 | Layer 3 | Layer 4 | Layer 5 |
|---|---|---|---|---|---|
| 103, 111 | Glass 1 | Example 94 | Solar Cell 1 | PVB | Glass 3 |
| 104, 112 | Glass 1 | Example 95 | Solar Cell 4 | Ionomer 23 | Glass 2 |

ACR 3 is a 20 mil (0.51 mm) thick embossed sheet of a poly(ethylene-co-methacrylic acid) containing 15 wt % of methacrylic acid and having a MI of 5.0 g/10 min (190° C., ISO 1133, ASTM D1238).
EBA 3 is a formulated composition based on poly(ethylene-co-butyl acrylate) containing 20 wt % of butyl acrylate based on the weight of the total copolymer in the form of 20 mil thick (0.51 mm) sheet.
EVA 2 is SC50B, believed to be a formulated composition based on poly(ethylene-co-vinyl acetate) in the form of 20 mil thick (0.51 mm) sheet, (a product of the Hi-Sheet Corporation (formerly Mitsui Chemicals Fabro, Inc.)).
Glass 1 is Starphire ® glass (3.2 mm thick) from the PPG Corporation.
Glass 2 is a clear annealed float glass plate layer (2.5 mm thick).
Glass 3 is a Solex ® solar control glass (3.0 mm thick).
Ionomer 23 is a 90 mil (2.25 mm) thick embossed sheet of a poly(ethylene-co-methacrylic acid) containing 18 wt % of methacrylic acid that is 30% neutralized with zinc ion and having a MI of 1 g/10 min (190° C., ISO 1133, ASTM D1238). Ionomer 23 is prepared from a poly(ethylene-co-methacrylic acid) having a MI of 60 g/10 min.
PVB is B51V, believed to be a formulated composition based on poly(vinyl butyral) in the form of 20 mil (0.51 mm) thick sheet (a product of the DuPont Corporation.

Examples 105-112

As listed in Table 12, Examples 105-112 are solar cell laminate structures prepared in a manner similar to that was used in preparing the glass laminates in Examples 1-42. For those laminates which include a flexible film as an outer layer, a glass cover sheet (3 mm thick) is added to the laminate structure and then removed after the lamination process. Layers 1 and 2 constitute the incident layer of the solar cell laminate and Layers 4 and 5 constitute the back layer of the solar cell laminate.

Examples 113-125

As listed in Table 13, Examples 113-117 are bi-layer sheet structures with embossed surface layers.

TABLE 13

Bi-layer Sheet Structures

| Example | Layer 1 (Thickness) | Layer 2 (Thickness) |
|---|---|---|
| 113 | Ionomer 16 (0.5 mil (0.013 mm)) | EBA 1 (19 mil (0.48 mm)) |
| 114 | Ionomer 19 (1 mil (0.03 mm)) | EVA 1 (19 mil (0.48 mm)) |
| 115 | Ionomer 20 (0.7 mil (0.018 mm)) | EMA 1 (13 mil (0.33 mm)) |
| 116 | ACR 1 (0.5 mil (0.013 mm)) | Ionomer 20 (18 mil (0.4 mm)) |
| 117 | Ionomer 22 (1 mil (0.03 mm)) | Ionomer 21 (19 mil (0.48 mm)) |

ACR 2 is a poly(ethylene-co-methacrylic acid) containing 19 wt % of methacrylic acid and having a MI of 2 g/10 min (190° C., ISO 1133, ASTM D1238).

As listed in Table 14, Examples 118-125 are solar cell laminate structures produced in a manner similar to that is used in preparing the laminate structures in Examples 43-54. For those Examples where it is possible, the ionomeric surface of the bi-layer sheet is in contact with a glass surface. Layers 1 and 2 constitute the incident layer of the solar cell laminate and Layers 4 and 5 constitute the back layer of the solar cell laminate.

TABLE 14

Solar Cell Laminate Structures.

| Example | Layer 1 | Layer 2 | Layer 3 | Layer 4 | Layer 5 |
|---|---|---|---|---|---|
| 118, 126 | Glass 1 | Example 113 | Solar Cell 1 | Example 113 | Glass 1 |
| 119, 127 | Glass 2 | Example 114 | Solar Cell 2 | Example 114 | Glass 2 |
| 120, 128 | FPF | Example 115 | Solar Cell 3 | Example 115 | ALF |
| 121, 129 | Glass 2 | Example 117 | Solar Cell 2 | EBA 3 | ALF |
| 122, 130 | Glass 1 | Example 114 | Solar Cell 4 | EVA 2 | ALF |
| 123, 131 | FPF | Example 116 | Solar Cell 1 | ACR 3 | ALF |
| 124, 132 | Glass 1 | Example 115 | Solar Cell 1 | PVB A | Glass 3 |
| 125, 133 | Glass 1 | Example 117 | Solar Cell 4 | Ionomer 24 | Glass 2 |

Ionomer 24 is a 20 mil (0.51 mm) thick embossed sheet of a poly(ethylene-co-methacrylic acid) containing 22 wt % of methacrylic acid that is 26% neutralized with zinc ion and having a MI of 0.75 g/10 min (190° C., ISO 1133, ASTM D1238). Ionomer 24 is prepared from a poly(ethylene-co-methacrylic acid) having a MI of 60 g/10 min.
PVB A is an acoustic poly(vinyl butyral) sheet including 100 parts per hundred (pph) poly(vinyl butyral) with a hydroxyl number of 15 plasticized with 48.5 pph plasticizer tetraethylene glycol diheptanoate prepared similarly to disclosed within WO 2004/039581.

Examples 126-133

As listed in Table 14, Examples 126-133 are 12 inch by 12 inch solar cell laminate structures produced in a manner similar to that is used in preparing the solar cell laminates of Examples 105-112. For those laminate structures where it is possible, the ionomeric surface of the bi-layer sheet is in contact with a glass surface. Layers 1 and 2 constitute the incident layer of the solar cell laminate and Layers 4 and 5 constitute the back layer of the solar cell laminate.

Examples 134-154

As listed in Table 15, Examples 134-138 are tri-layer film structures with embossed surface layers.

TABLE 15

Tri-layer Film Structures

| Example | Outer Layers (Thickness) | Inner Layer (Thickness) |
|---|---|---|
| 134 | Ionomer 18 (0.5 mil (0.013 mm)) | EBA 2 (19 mil (0.48 mm)) |
| 135 | Ionomer 19 (1 mil (0.03 mm)) | EEA 1 (18 mil (0.4 mm)) |
| 136 | Ionomer 20 (0.7 mil (0.018 mm)) | EMA 2 (13 mil (0.33 mm)) |
| 137 | Ionomer 20 (0.5 mil (0.013 mm)) | Ionomer 21 (19 mil (0.48 mm)) |
| 138 | Ionomer 19 (1 mil (0.03 mm)) | EVA 1 (18 mil (0.4 mm)) |

As listed in Table 16, Examples 139-154 are 12 inch by 12 inch solar cell laminate structures produced in a manner similar to that was used in preparing the laminates in Examples 43-54. Layers 1 and 2 constitute the incident layer of the solar cell laminate and Layers 4 and 5 constitute the back layer of the solar cell laminate.

TABLE 16

Solar Cell Laminate Structures.

| Example | Layer 1 | Layer 2 | Layer 3 | Layer 4 | Layer 5 |
|---|---|---|---|---|---|
| 139, 155 | Glass 1 | Example 134 | Solar Cell 1 | Example 134 | Glass 1 |
| 140, 156 | Glass 2 | Example 135 | Solar Cell 2 | Example 135 | Glass 2 |
| 141, 157 | Glass 1 | Example 136 | Solar Cell 3 | Example 136 | Glass 2 |
| 142, 158 | Glass 1 | Example 137 | Solar Cell 4 | Example 137 | Glass 2 |
| 143, 159 | Glass 1 | Example 138 | Solar Cell 1 | Example 138 | ALF |

TABLE 16-continued

Solar Cell Laminate Structures.

| Example | Layer 1 | Layer 2 | Layer 3 | Layer 4 | Layer 5 |
|---|---|---|---|---|---|
| 144, 160 | Glass 2 | Example 134 | Solar Cell 2 | EBA 3 | ALF |
| 145, 161 | Glass 2 | Example 135 | Solar Cell 3 | EMA 3 | ALF |
| 146, 162 | Glass 1 | Example 136 | Solar Cell 4 | EVA 2 | ALF |
| 147, 163 | FPF | Example 137 | Solar Cell 1 | PVB | ALF |
| 148, 164 | FPF | Example 137 | Solar Cell 2 | Example 138 | ALF |
| 149, 165 | Glass 1 | Ionomer 24 | Solar Cell 1 | Example 138 | Glass 3 |
| 150, 166 | Glass 1 | Example 137 | Solar Cell 4 | Ionomer 23 | Glass 2 |
| 151, 167 | Glass 1 | Example 134 | Solar Cell 1 | PVB A | Glass 2 |
| 151, 168 | Glass 2 | Example 135 | Solar Cell 4 | PVB S | Glass 2 |
| 153, 169 | FPF | Example 137 | Solar Cell 1 | Example 136 | Glass 2 |
| 154, 170 | Glass 1 | Example 137 | Solar Cell 1 | Example 134 | Glass 3 |

EMA 3 is a formulated composition based on poly(ethylene-co-methyl acrylate) containing 20 wt % of methyl acrylate based on the weight of the total copolymer in the form of 20 mil (0.51 mm) thick sheet.
PVB S is a 20 mil thick (0.51 mm) stiff poly(vinyl butyral) sheet prepared similarly to that disclosed in Example 2, WO 03/078160.

Examples 155-170

As listed in Table 16, Examples 155-170 are 12 inch by 12 inch solar cell laminate structures produced in a manner similar to that is used in preparing the laminates of in Example 105-112. Layers 1 and 2 constitute the incident layer of the solar cell laminate and Layers 4 and 5 constitute the back layer of the solar cell laminate.

What is claimed is:

1. An assembly for preparing a solar cell module comprising:
   (i) a first encapsulant layer,
   (ii) a solar cell layer comprising one or a plurality of electronically interconnected solar cells and having two opposite surfaces, a light-receiving surface and a rear surface, and
   (iii) an optional second encapsulant layer,
   wherein:
   a) said first encapsulant layer has a total thickness of from about 0.1 to about 20 mils;
   b) said first encapsulant layer is made from an ionomeric composition consisting of one ionomer and optionally one or more additives, wherein said ionomer comprises a finite amount of polymerized residues of an α-olefin and greater than or equal to 18 wt % of polymerized residues of an α, β-ethylenically unsaturated carboxylic acid based on the total weight of the ionomer, which is neutralized from about 10% to about 50% with zinc ions, based on the total carboxylic acid content; and
   c) when said optional second encapsulant layer is present, said first and said second encapsulant layers are laminated to each of said two opposite surfaces of said solar cell layer.

2. The assembly for preparing a solar cell module of claim 1, wherein said ionomer comprises from 20 to 23 wt % of polymerized residues of the α, β-ethylenically unsaturated carboxylic acid based on the total weight of the ionomer.

3. The assembly for preparing a solar cell module of claim 1, wherein said ionomer is about 20% to about 40% neutralized with the zinc ions based on the total carboxylic acid content.

4. The assembly for preparing a solar cell module of claim 1, wherein said ionomer has a melt index (MI) of less than about 10 g/10 min at 190° C.

5. The assembly for preparing a solar cell module of claim 4, wherein said ionomer has a MI of less than about 5 g/10 min at 190° C.

6. The assembly for preparing a solar cell module of claim 5, wherein said ionomer has a MI of less than about 3 g/10 min at 190° C.

7. The assembly for preparing a solar cell module of claim 1, wherein at least one surface of said first encapsulant layer is a rough surface.

8. The assembly for preparing a solar cell module of claim 7, wherein both surfaces of said first encapsulant layer are rough surfaces.

9. The assembly for preparing a solar cell module of claim 1, wherein said first encapsulant layer is laminated to said light-receiving surface of said solar cell layer and said optional second encapsulant layer is present and is laminated to said rear surface of said solar cell layer.

10. The assembly for preparing a solar cell module of claim 9, further comprising (iv) an incident layer laminated to said first encapsulant layer and away from said solar cell layer, and (v) a back-sheet laminated to said rear surface of said solar cell layer, or to said optional second encapsulant layer and away from said solar cell layer when the optional second encapsulant layer is present.

11. The assembly for preparing a solar cell module of claim 10, wherein said incident layer is made of transparent material.

12. The assembly for preparing a solar cell module of claim 11, wherein said transparent material is selected from the group consisting of glass and fluoropolymers.

13. The assembly for preparing a solar cell module of claim 12, wherein (1) said ionomer comprises from 20 to 23 wt % of polymerized residues of the α, β-ethylenically unsaturated carboxylic acid based on the total weight of the ionomer, (2) said ionomer is about 20% to about 40% neutralized with zinc ions based on the total carboxylic acid content, and (3) said ionomer has a MI of less than about 5 g/10 min at 190° C.

14. The assembly for preparing a solar cell module of claim 13 wherein the first encapsulant layer is prepared from a single-layer film of said ionomeric composition.

15. The assembly for preparing a solar cell module of claim 14, wherein said an α-olefin is selected from the group consisting of ethylene, propylene, 1-butene, 1-pentene, 1-hexene, 1-heptene, 3-methyl-1-butene, 4-methyl-1-pentene, and mixtures thereof, and said α, β-ethylenically unsaturated carboxylic acid is selected from the group consisting of acrylic acid, methacrylic acid, itaconic acid, maleic acid, maleic anhydride, fumaric acid, monomethyl maleic acid, and mixtures thereof.

16. The assembly for preparing a solar cell module of claim 14, wherein said α-olefin is ethylene and said α, β-ethylenically unsaturated carboxylic acid is selected from the group consisting of acrylic acid and methacrylic acid.

17. The assembly for preparing a solar cell module of claim 10, wherein said back-sheet is made of a sheet or film selected from the group consisting of glass, plastic sheets or films, and metal sheets or films.

18. The assembly for preparing a solar cell module of claim 1, wherein said solar cells are selected from the group consisting of multi-crystalline solar cells, thin film-solar cells, compound semiconductor solar cells, and amorphous silicon solar cells.

19. The assembly for preparing a solar cell module of claim 1, wherein said optional second encapsulant layer is present and has the same composition as said first encapsulant layer.

20. The assembly for preparing a solar cell module of claim 1, wherein said optional second encapsulant layer is present and comprises a film or sheet comprising a composition selected from the group consisting of ionomers, ethylene vinyl acetate, acoustic poly(vinyl acetal), polyvinyl butyral, polyurethane, polyvinylchloride, metallocene-catalyzed linear low density polyethylenes, polyolefin block elastomers, ethylene acrylate ester copolymers, acid copolymers, silicone elastomers and epoxy resins.

21. The assembly for preparing a solar cell module of claim 1, wherein said optional second encapsulant layer is present and comprises a film or sheet comprising a composition selected from the group consisting of ethylene vinyl acetate and polyvinyl butyral.

22. The assembly for preparing a solar cell module of claim 1, wherein (1) said ionomer comprises from greater than 20 wt % to 23 wt % of polymerized residues of the $\alpha$, $\beta$-ethylenically unsaturated carboxylic acid based on the total weight of the ionomer, (2) said ionomer is about 20% to about 40% neutralized with the zinc ions based on the total carboxylic acid content, (3) said ionomer has a MI of less than about 3 g/10 min at 190° C., (4) the first encapsulant layer is prepared from a single-layer film of said ionomeric composition, (5) said $\alpha$-olefin is ethylene, and (6) said $\alpha$, $\beta$-ethylenically unsaturated carboxylic acid is selected from the group consisting of acrylic acid and methacrylic acid.

23. An assembly for preparing a solar cell module comprising:
  (i) a first encapsulant layer,
  (ii) a solar cell layer comprising one or a plurality of electronically interconnected solar cells and having two opposite surfaces, a light-receiving surface and a rear surface, and
  (iii) an optional second encapsulant layer,
  wherein:
    a) said first encapsulant layer has a total thickness of from about 0.1 to about 20 mils;
    b) said first encapsulant layer comprises at least one surface layer of an ionomeric composition consisting of one ionomer and optionally one or more additives, wherein the ionomer comprises a finite amount of polymerized residues of an $\alpha$-olefin and from about 20 to about 23 wt % of polymerized residues of an $\alpha$, $\beta$-ethylenically unsaturated carboxylic acid based on the total weight of the ionomer, and is neutralized from about 10% to about 50% with zinc ions, based on the total carboxylic acid content;
    c) said first encapsulant layer further comprises one or more additional polymeric layers wherein said one or more additional polymeric layers are selected from the group consisting of ethylene vinyl acetate, acoustic poly(vinyl acetal), polyvinyl butyral, polyurethane, polyvinylchloride, polyolefin block elastomers, ethylene acrylate ester copolymers, acid copolymers, silicone elastomers, epoxy resins and combinations thereof; and
    d) when said optional second encapsulant layer is present, said first and said second encapsulant layers are laminated to each of said two opposite surfaces of said solar cell layer.

24. The assembly for preparing a solar cell module of claim 23, wherein said ionomer is about 20% to about 40% neutralized with zinc ions based on the total carboxylic acid content.

25. An assembly for preparing a solar cell module consisting essentially of, from top to bottom, (i) an incident layer made of transparent material, which is laminated to, (ii) a first encapsulant layer that is laminated to, (iii) a solar cell layer comprising one or a plurality of electronically interconnected solar cells, which is laminated to, (iv) an optional second encapsulant layer that is laminated to, (v) a back-sheet, wherein said first encapsulant layer has a total thickness of from about 0.1 to about 20 mils and is made from an ionomeric composition consists of one ionomer and optionally one or more additives, wherein said ionomer comprises a finite amount of polymerized residues of an $\alpha$-olefin and from about 20 to about 23 wt % of polymerized residues of an $\alpha$, $\beta$-ethylenically unsaturated carboxylic acid based on the total weight of the ionomer, and is neutralized from about 10% to about 50% with zinc ions, based on the total carboxylic acid content.

26. The assembly for preparing a solar cell module of claim 25, wherein said ionomer has a MI of less than about 5 g/10 min at 190° C.

27. The assembly for preparing a solar cell module of claim 25, wherein (1) said ionomer comprises from greater than 20 wt % to 23 wt % of polymerized residues of the $\alpha$, $\beta$-ethylenically unsaturated carboxylic acid based on the total weight of the ionomer, (2) said ionomer is about 20% to about 40% neutralized with the zinc ions based on the total carboxylic acid content, (3) said ionomer has a MI of less than about 3 g/10 min at 190° C., (4) the first encapsulant layer is prepared from a single-layer film of said ionomeric composition, (5) said $\alpha$-olefin is ethylene, and (6) said $\alpha$, $\beta$-ethylenically unsaturated carboxylic acid is selected from the group consisting of acrylic acid and methacrylic acid.

28. An assembly for preparing a solar cell module comprising:
  (a) a first encapsulant layer having a total thickness of from about 0.1 to about 20 mils which is a multilayer film having two surface layers of ionomeric composition and one or more additional polymeric layers, wherein:
    (i) said ionomeric composition consists of one ionomer and optionally one or more additives, wherein said ionomer comprises a finite amount of polymerized residues of an $\alpha$-olefin and from about 20 to about 23 wt % of polymerized residues of an $\alpha$, $\beta$-ethylenically unsaturated carboxylic acid based on the total weight of the ionomer, and is neutralized from about 10% to about 50% with zinc ions, based on the total carboxylic acid content; and
    (ii) said one or more additional polymeric layers are selected from the group consisting of ionomers, ethylene vinyl acetate, acoustic poly(vinyl acetal), polyvinyl butyral, polyurethane, polyvinylchloride, polyolefin block elastomers, ethylene acrylate ester copolymers, acid copolymers, silicone elastomers, epoxy resins and combinations thereof;
  (b) a solar cell layer comprising one or a plurality of electronically interconnected solar cells and having two opposite surfaces, a light-receiving surface and a rear surface; and (c) an optional second encapsulant layer, wherein when said optional second encapsulant layer is present, said first and said second encapsulant layers are laminated to each of said two opposite surfaces of said solar cell layer.

29. An assembly for preparing a solar cell module comprising:
  (i) a first encapsulant layer,
  (ii) a solar cell layer comprising one or a plurality of electronically interconnected solar cells and having two opposite surfaces, a light-receiving surface and a rear surface, and
  (iii) an optional second encapsulant layer,
  wherein
    a) said first encapsulant layer has a total thickness of from about 0.1 to about 20 mils;

b) said first encapsulant layer comprises bi-layer film with at least one surface layer derived from an ionomeric composition consisting of one ionomer and optionally one or more additives, wherein said ionomer comprises a finite amount of polymerized residues of an α-olefin and from about 20 to about 23 wt % of polymerized residues of an α, β-ethylenically unsaturated carboxylic acid based on the total weight of the ionomer, and is neutralized from about 10% to about 50% with zinc ions, based on the total carboxylic acid content; and c) said first encapsulant layer further comprises an additional polymeric layer of a polymer selected from the group consisting of ethylene vinyl acetate, acoustic poly(vinyl acetal), polyvinyl butyral, polyurethane, polyvinylchloride, polyolefin block elastomers, ethylene acrylate ester copolymers, acid copolymers, silicone elastomers, epoxy resins and combinations thereof; and d) when said optional second encapsulant layer is present, said first and said second encapsulant layers are laminated to each of said two opposite surfaces of said solar cell layer.

30. A process of manufacturing a solar cell module comprising: (i) providing an assembly comprising, from top to bottom, an incident layer, a first encapsulant layer, a solar cell layer comprising one or a plurality of electronically interconnected solar cells, an optional second encapsulant layer, and a back-sheet and (ii) laminating the assembly to form the solar cell module, wherein said first encapsulant layer has a total thickness of from about 0.1 to about 20 mils and is made from an ionomeric composition consisting of one ionomer and optionally one or more additives, wherein said ionomer comprises a finite amount of polymerized residues of an α-olefin and from about 20 to about 23 wt % of polymerized residues of an α, β-ethylenically unsaturated carboxylic acid based on the total weight of the ionomer, and is neutralized from about 10% to about 50% with zinc ions, based on the total carboxylic acid content.

31. The process of claim 30, wherein the step (ii) of lamination is conducted by subjecting the assembly to heat.

32. The process of claim 31, wherein the step (ii) of lamination further comprising subjecting the assembly to pressure.

33. The process of claim 31, wherein the step (ii) of lamination further comprising subjecting the assembly to vacuum.

34. The process of claim 31, wherein (1) said ionomer comprises from 20 to 23 wt % of polymerized residues of the α, β-ethylenically unsaturated carboxylic acid based on the total weight of the ionomer, (2) said ionomer is about 20% to about 40% neutralized with the zinc ions based on the total carboxylic acid content, (3) said ionomer has a MI of less than about 5 g/10 min at 190° C., (4) said an α-olefin is selected from the group consisting of ethylene, propylene, 1-butene, 1-pentene, 1-hexene, 1-heptene, 3-methyl-1-butene, 4-methyl-1-pentene, and mixtures thereof, (5) said α, β-ethylenically unsaturated carboxylic acid is selected from the group consisting of acrylic acid, methacrylic acid, itaconic acid, maleic acid, maleic anhydride, fumaric acid, monomethyl maleic acid, and mixtures thereof, and (6) the first encapsulant layer is a single-layer film of said ionomer.

35. The process of claim 34, wherein said an α-olefin is ethylene and said α, β-ethylenically unsaturated carboxylic acid is selected from the group consisting of acrylic acid and methacrylic acid.

36. The process of claim 35, wherein said optional second encapsulant layer is present and comprises a film or sheet comprising a composition selected from the group consisting of ethylene vinyl acetate and polyvinyl butyral.

37. The process of claim 35, wherein said optional second encapsulant layer is present and has the same composition as said first encapsulant layer.

38. The process of claim 35, wherein said ionomer comprises from greater than 20 wt % to 23 wt % of polymerized residues of the α, β-ethylenically unsaturated carboxylic acid based on the total weight of the ionomer.

* * * * *